(12) United States Patent
Tang et al.

(10) Patent No.: US 7,687,857 B2
(45) Date of Patent: Mar. 30, 2010

(54) INTEGRATED CIRCUITS

(75) Inventors: Sanh D. Tang, Boise, ID (US); Gordon Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 132 days.

(21) Appl. No.: 11/957,013

(22) Filed: Dec. 14, 2007

(65) Prior Publication Data

US 2008/0099847 A1    May 1, 2008

Related U.S. Application Data

(62) Division of application No. 11/704,487, filed on Feb. 9, 2007, now Pat. No. 7,329,924, which is a division of application No. 11/076,774, filed on Mar. 10, 2005, now Pat. No. 7,244,659.

(51) Int. Cl.
     *H01L 29/786* (2006.01)
(52) U.S. Cl. .............................. 257/353; 257/E21.618; 257/E21.619; 257/E27.112
(58) Field of Classification Search ................. 257/353, 257/E21.618, E21.619, E27.112
See application file for complete search history.

(56) References Cited

U.S. PATENT DOCUMENTS

| 4,820,654 A | 4/1989 | Lee |
| 5,013,680 A | 5/1991 | Lowrey et al. |
| 5,021,843 A | 6/1991 | Ohmi |
| 5,122,848 A | 6/1992 | Lee et al. |
| 5,374,329 A | 12/1994 | Miyawaki |
| 5,405,802 A | 4/1995 | Yamagata et al. |
| 5,453,394 A | 9/1995 | Yonehara et al. |
| 5,670,411 A | 9/1997 | Yonehara et al. |
| 5,767,020 A | 6/1998 | Sakaguchi et al. |
| 5,773,355 A | 6/1998 | Inoue et al. |
| 5,841,171 A | 11/1998 | Iwamatsu et al. |
| 5,849,627 A | 12/1998 | Linn et al. |
| 5,882,532 A | 3/1999 | Field et al. |
| 5,909,618 A | 6/1999 | Forbes et al. |
| 5,910,672 A | 6/1999 | Iwamatsu et al. |
| 5,963,469 A | 10/1999 | Forbes |

(Continued)

OTHER PUBLICATIONS

Bashir et al., "Characterization of sidewall defects in selective epitaxial growth of silicon", 1995 American Vacuum Society, May/Jun. 1995, pp. 923-927.

(Continued)

*Primary Examiner*—Trung Dang
(74) *Attorney, Agent, or Firm*—Wells St. John P.S.

(57) ABSTRACT

Integrated circuits and methods of forming field effect transistors are disclosed. In one aspect, an integrated circuit includes a semiconductor substrate comprising bulk semiconductive material. Electrically insulative material is received within the bulk semiconductive material. Semiconductor material is formed on the insulative material. A field effect transistor is included and comprises a gate, a channel region, and a pair of source/drain regions. In one implementation, one of the source/drain regions is formed in the semiconductor material, and the other of the source/drain regions is formed in the bulk semiconductive material. In one implementation, the electrically insulative material extends from beneath one of the source/drain regions to beneath only a portion of the channel region. Other aspects and implementations, including methodical aspects, are disclosed.

19 Claims, 29 Drawing Sheets

U.S. PATENT DOCUMENTS

| | | | |
|---|---|---|---|
| 5,977,579 A | 11/1999 | Noble | |
| 6,010,921 A | 1/2000 | Soutome | |
| 6,037,634 A | 3/2000 | Akiyama | |
| 6,048,411 A | 4/2000 | Henley et al. | |
| 6,071,783 A | 6/2000 | Liang et al. | |
| 6,072,209 A | 6/2000 | Noble et al. | |
| 6,091,076 A | 7/2000 | Deleonibus | |
| 6,147,384 A | 11/2000 | Chen | |
| 6,150,687 A | 11/2000 | Noble et al. | |
| 6,191,470 B1 | 2/2001 | Forbes et al. | |
| 6,215,155 B1 | 4/2001 | Wollesen | |
| 6,245,636 B1 | 6/2001 | Maszara | |
| 6,255,731 B1 | 7/2001 | Ohmi et al. | |
| 6,265,327 B1 | 7/2001 | Kobayashi et al. | |
| 6,268,630 B1 | 7/2001 | Schwank et al. | |
| 6,313,014 B1 | 11/2001 | Sakaguchi et al. | |
| 6,340,829 B1 | 1/2002 | Hirano et al. | |
| 6,346,729 B1 | 2/2002 | Liang et al. | |
| 6,350,703 B1 | 2/2002 | Sakaguchi et al. | |
| 6,358,791 B1 | 3/2002 | Hsu et al. | |
| 6,362,082 B1 | 3/2002 | Doyle et al. | |
| 6,403,485 B1 | 6/2002 | Quek et al. | |
| 6,410,938 B1 | 6/2002 | Xiang | |
| 6,433,401 B1 | 8/2002 | Clark et al. | |
| 6,498,062 B2 | 12/2002 | Durcan et al. | |
| 6,509,613 B1 | 1/2003 | En et al. | |
| 6,512,244 B1 | 1/2003 | Ju et al. | |
| 6,531,375 B1 | 3/2003 | Giewont et al. | |
| 6,534,380 B1 | 3/2003 | Yamauchi et al. | |
| 6,541,861 B2 | 4/2003 | Higashi et al. | |
| 6,552,396 B1 | 4/2003 | Bryant et al. | |
| 6,552,496 B2 | 4/2003 | Yamazaki | |
| 6,570,217 B1 | 5/2003 | Sato et al. | |
| 6,599,789 B1 | 7/2003 | Abbott et al. | |
| 6,610,615 B1 | 8/2003 | McFadden et al. | |
| 6,642,579 B2 | 11/2003 | Fung | |
| 6,649,959 B2 | 11/2003 | Hsu et al. | |
| 6,661,065 B2 | 12/2003 | Kunikiyo | |
| 6,664,146 B1 | 12/2003 | Yu | |
| 6,680,243 B1 | 1/2004 | Kamath et al. | |
| 6,683,364 B2 | 1/2004 | Oh et al. | |
| 6,696,746 B1 | 2/2004 | Farrar et al. | |
| 6,844,591 B1 | 1/2005 | Tran | |
| 6,906,384 B2 * | 6/2005 | Yamada et al. | 257/347 |
| 7,029,989 B2 | 4/2006 | Kim et al. | |
| 7,071,043 B2 | 7/2006 | Tang et al. | |
| 7,122,425 B2 | 10/2006 | Chance et al. | |
| 7,214,621 B2 | 5/2007 | Nejad et al. | |
| 7,244,659 B2 | 7/2007 | Tang et al. | |
| 7,262,089 B2 | 8/2007 | Abbott et al. | |
| 7,282,401 B2 | 10/2007 | Juengling | |
| 7,285,812 B2 | 10/2007 | Tang et al. | |
| 7,294,562 B2 * | 11/2007 | Nagano et al. | 438/481 |
| 7,335,963 B2 | 2/2008 | Ford | |
| 7,349,232 B2 | 3/2008 | Wang et al. | |
| 7,384,849 B2 | 6/2008 | Parekh et al. | |
| 2001/0020722 A1 | 9/2001 | Yang | |
| 2002/0011670 A1 | 1/2002 | Higashi et al. | |
| 2002/0034844 A1 | 3/2002 | Hsu et al. | |
| 2002/0048844 A1 | 4/2002 | Sakaguchi | |
| 2002/0070454 A1 | 6/2002 | Yasukawa | |
| 2002/0134503 A1 | 9/2002 | Hussinger et al. | |
| 2003/0085424 A1 | 5/2003 | Bryant et al. | |
| 2005/0062080 A1 | 3/2005 | Nakamura et al. | |
| 2005/0176222 A1 | 8/2005 | Ogura | |

OTHER PUBLICATIONS

Bashir et al., "Reduction of sidewall defect induced leakage currents by the use of nitrided field oxides in silicon selective opitaxial growth isolation for advanced ultralarge scale integration", American Vacuum Society, Mar./Apr. 2000, pp. 695-699.

Bernstein et al., "SOI Device Electrical Properties", SOI Circuit Design Concepts, pp. 34-53.

Hammad et al., The Pseudo-Two-Dimensional Approach to Model the Drain Section in SOI MOSFETs, 2001 IEEE, vol. 48, Nop. 2, Feb. 2001, pp. 386-387.

Sivagnaname et al., "Stand-by Current in PD-SOI Pseudo-nMOS Circuits", 2003 IEEE, pp. 95-96.

Wang et at "Achieving Low Junction Capacitance on Bulk SI MOSFET Using SDOI Process", Micron Technology, Inc., 12 pages.

* cited by examiner

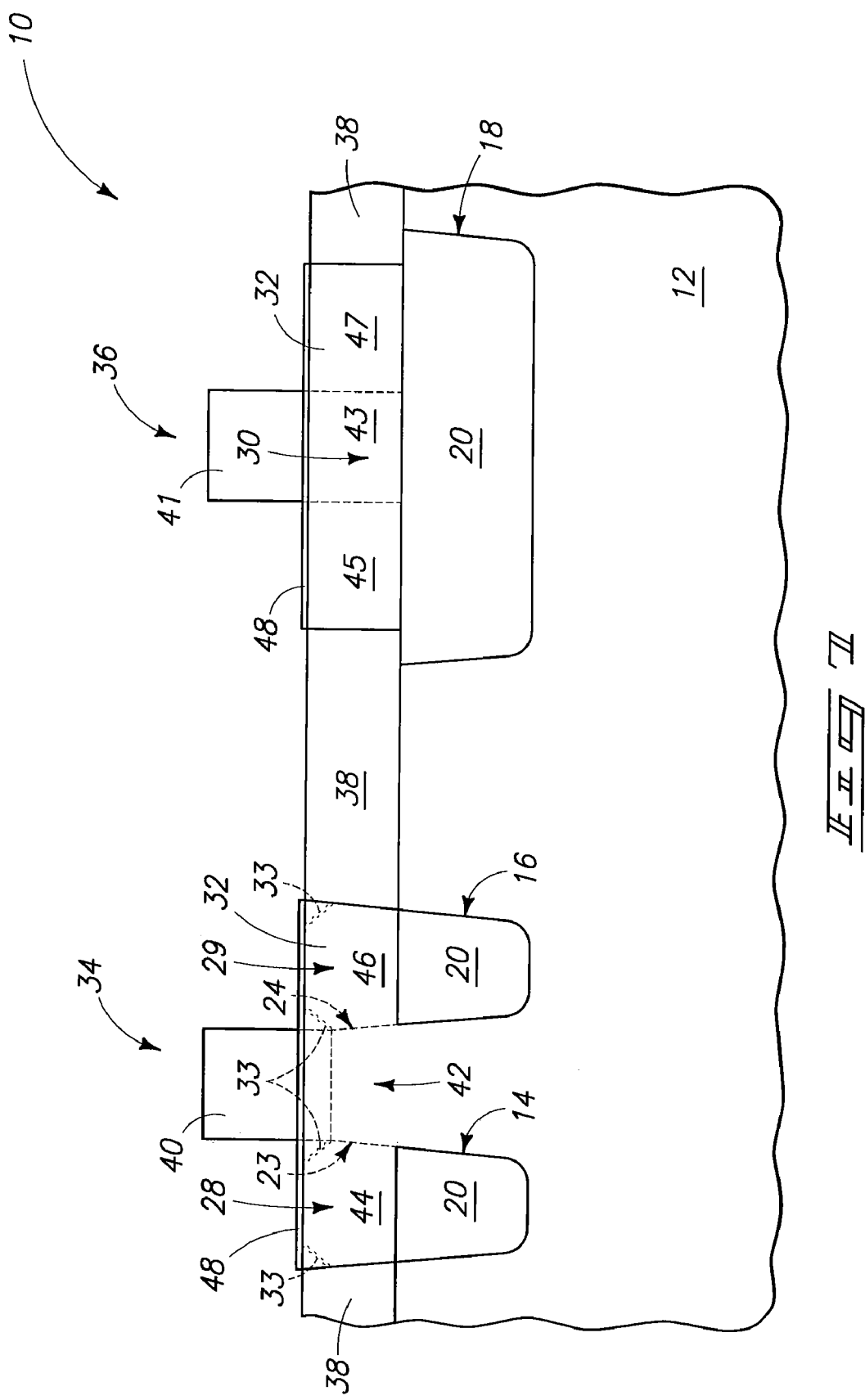

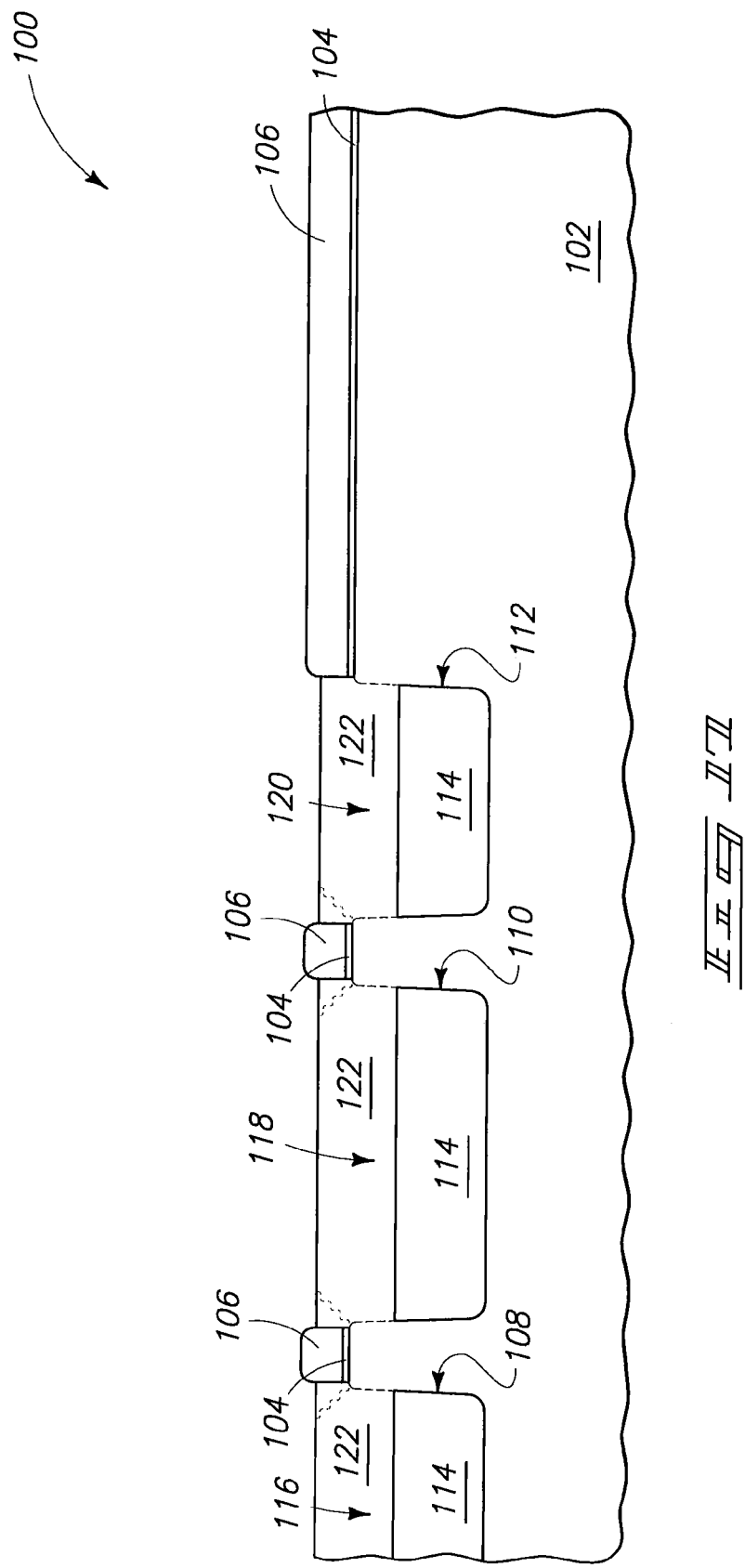

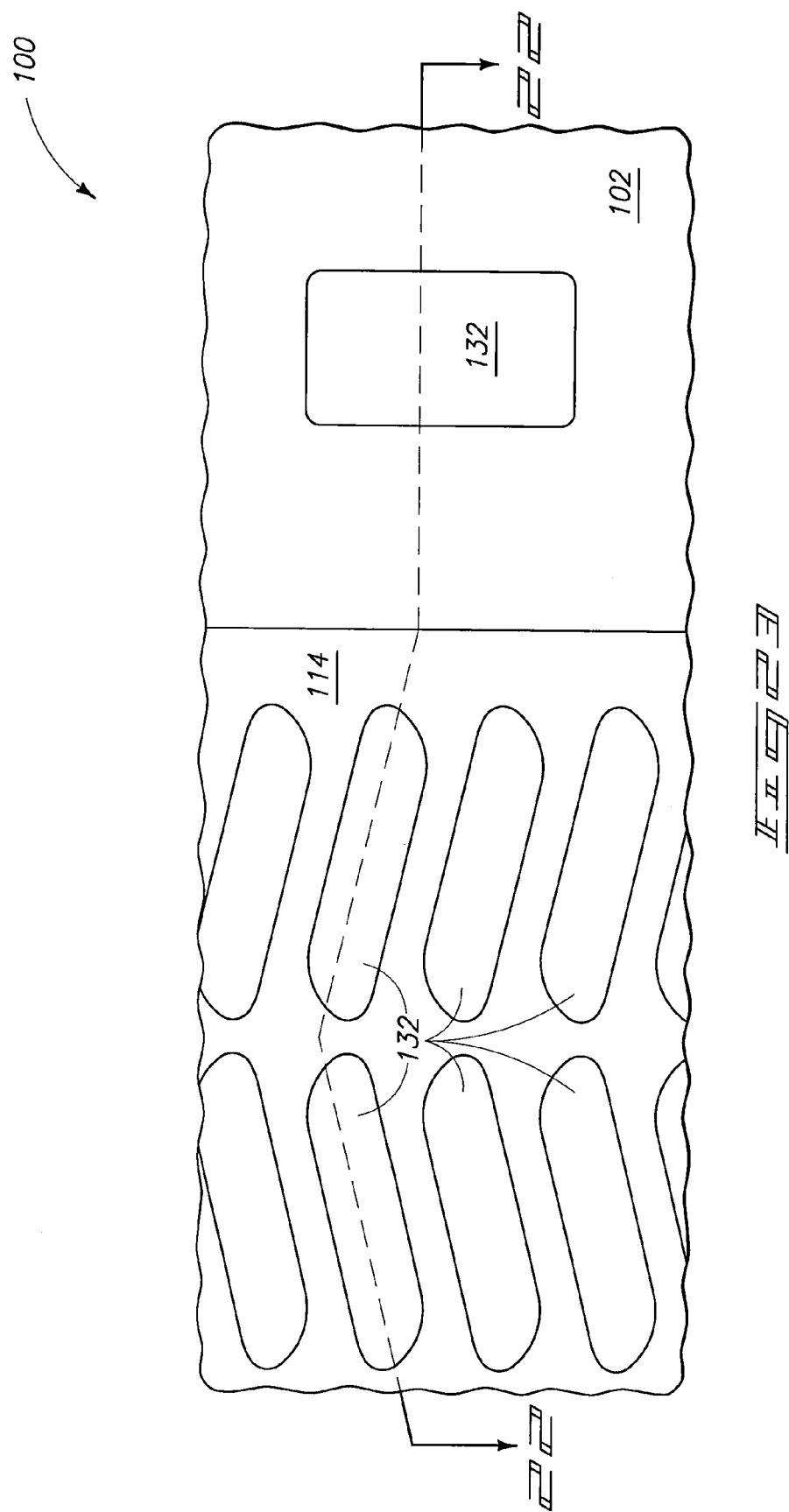

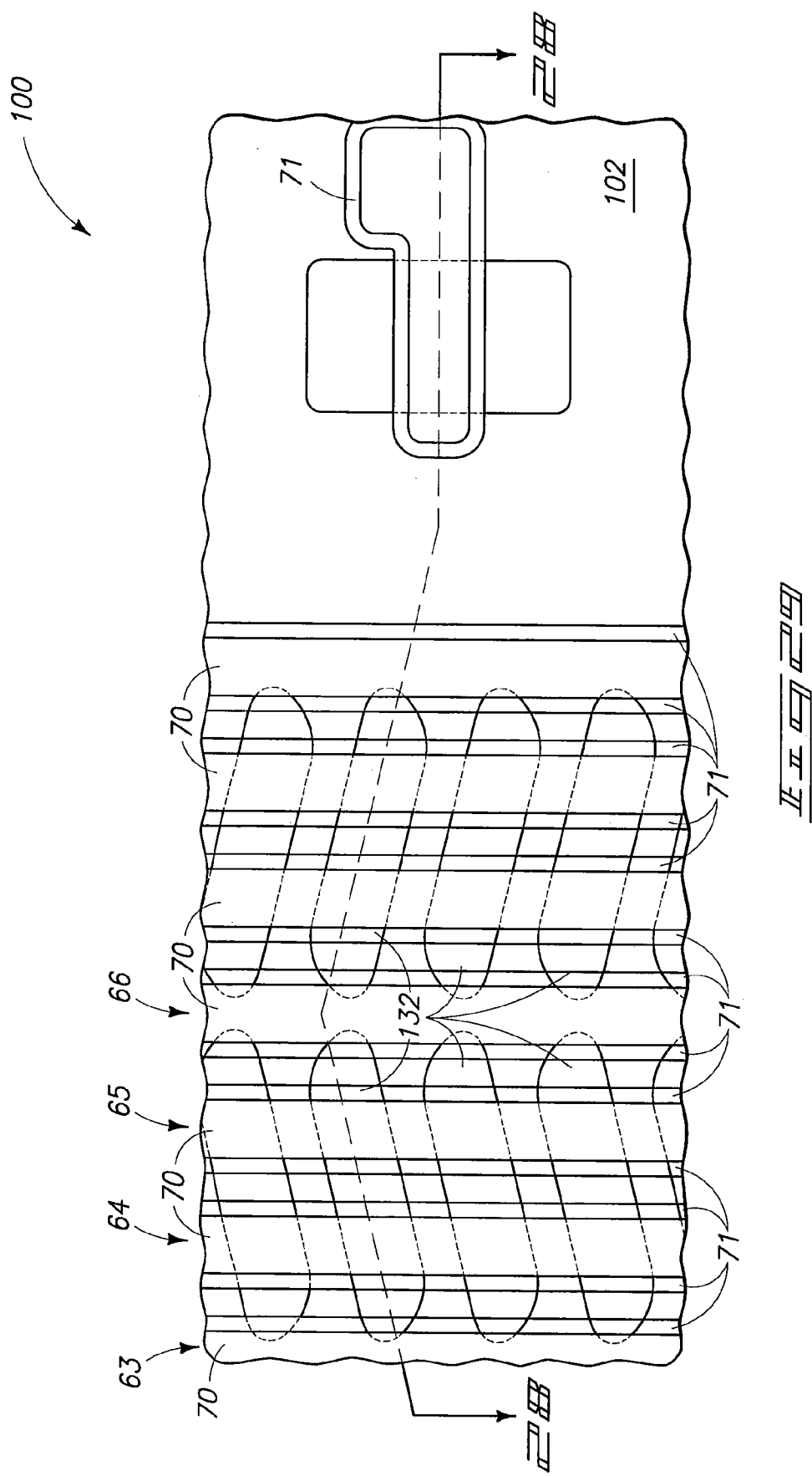

INTEGRATED CIRCUITS

RELATED PATENT DATA

This patent resulted from a divisional application of U.S. patent application Ser. No. 11/704,487, filed Feb. 9, 2007, entitled "Integrated Circuits and Methods of Forming a Field Effect Transistor", naming Sanh D. Tang and Gordon A. Haller as inventors, now U.S. Pat. No. 7,329,924, the disclosure of which is incorporated by reference; which patent resulted from a divisional application of U.S. patent application Ser. No. 11/076,774, filed Mar. 10, 2005, entitled "Integrated Circuits and Methods of Forming a Field Effect Transistor", naming Sanh D. Tang and Gordon A. Haller as inventors, now U.S. Pat. No. 7,244,659, the disclosure of which is incorporated by reference.

TECHNICAL FIELD

This invention relates to integrated circuits and to methods of forming field effect transistors.

BACKGROUND OF THE INVENTION

One common integrated circuit device is a field effect transistor. Such includes a pair of source/drain regions having a semiconductive channel region received operably therebetween. A conductive gate is received proximate the channel region, and is separated therefrom by a gate dielectric. Suitable voltage applied to the gate can enable or cause current flow between the source/drain regions through the semiconductive channel region.

Integrated circuitry can be fabricated relative to one or both of bulk semiconductor substrates, such as monocrystalline silicon wafers, and semiconductor-on-insulator (SOI) substrates. SOI forms a semiconductive layer, for example monocrystalline silicon, onto an insulator, for example silicon dioxide. One manner of forming SOI circuitry, at least in part, includes epitaxially growing monocrystalline silicon selectively from a monocrystalline silicon surface. Unfortunately in some instances, epitaxially-grown silicon tends to form crystalline stacking faults, also known as dislocations, which can result in undesired leakage within or between the ultimately fabricated devices. Accordingly, the invention was motivated towards minimizing or eliminating stacking faults in the fabrication of field effect transistors involving epitaxially growing a silicon-comprising material.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes integrated circuits and methods of forming field effect transistors.

In one implementation, an integrated circuit includes a semiconductor substrate comprising bulk semiconductive material. Electrically insulative material is received within the bulk semiconductive material. Semiconductor material is formed on the insulative material. A field effect transistor is included and comprises a gate, a channel region, and a pair of source/drain regions. The channel region is received partially within the semiconductor material and partially within the bulk semiconductive material.

In one implementation, an integrated circuit includes a semiconductor substrate comprising bulk semiconductive material. Electrically insulative material is received within the bulk semiconductive material. Semiconductor material is formed on the insulative material. A field effect transistor is included and comprises a gate, a channel region, and a pair of source/drain regions. One of the source/drain regions is formed in the semiconductor material, and the other of the source/drain regions is formed in the bulk semiconductive material.

In one implementation, an integrated circuit includes a semiconductor substrate comprising bulk semiconductive material. Electrically insulative material is received within the bulk semiconductive material. Semiconductor material is formed on the insulative material. A field effect transistor is included and comprises a gate, a channel region, and a pair of source/drain regions. The electrically insulative material extends from beneath one of the source/drain regions to beneath only a portion of the channel region.

In one implementation, an integrated circuit includes a semiconductor substrate comprising bulk semiconductive material. Electrically insulative material is received within the bulk semiconductive material. A semiconductor material is formed on the insulative material. A field effect transistor is included which comprises a gate, a channel region, and a pair of source/drain regions. At least a portion of at least one of a) the channel region and b) at least one of the source/drain regions is received within the semiconductor material over the insulative material. Such portion comprises a void received within the semiconductor material and extending to the insulative material.

In one implementation, a method of forming a field effect transistor includes forming electrically insulative trench isolation material within isolation trenches formed within bulk semiconductive silicon-comprising material. The bulk semiconductive silicon-comprising material has an outermost surface. Some of the trench isolation material is etched effective to recess it relative to said outermost surface and expose sidewalls of the bulk semiconductive silicon-comprising material within the isolation trenches. The etching forms recesses within the bulk semiconductive silicon-comprising material relative to said outermost surface over the trench isolation material within the isolation trenches. Epitaxially-grown silicon-comprising material is grown from the exposed sidewalls effective to form epitaxially-grown silicon-comprising material within the isolation trenches and forming crystalline stacking faults in part of the epitaxially-grown silicon-comprising material. A field effect transistor is formed, and which comprises a gate, a channel region, and a pair of source/drain regions. At least a portion of at least one of a) the channel region and b) at least one of the source/drain regions is received within the epitaxially-grown silicon-comprising material. The part of the epitaxially-grown silicon-comprising material comprising the stacking faults is removed effective to remove the crystalline stacking faults prior to forming said portion.

In one implementation, a method of forming a field effect transistor includes forming a silicon nitride-comprising masking material over a bulk semiconductive silicon-comprising material. The bulk semiconductive silicon-comprising material has an outermost surface over which the silicon nitride-comprising masking material is formed. Isolation trenches are formed into the bulk semiconductive silicon-comprising material using the silicon nitride-comprising masking material as a mask. Electrically insulative trench isolation material is formed within the isolation trenches formed within the bulk semiconductive silicon-comprising material. The silicon nitride-comprising masking material is removed from over the outermost surface. Some of the trench isolation material is etched effective to recess it relative to said outermost surface and expose opposing sidewalls of the bulk semiconductive silicon-comprising material within at least one of the isolation trenches. The etching forms a recess within the bulk semiconductive silicon-comprising material relative to said outermost surface over the trench isolation material within said one isolation trench. After such removing, epitaxial silicon-comprising material is grown from said exposed opposing sidewalls effective to form epitaxially-grown silicon-comprising material within said at least one isolation trench. A field effect transistor is formed, and which comprises a gate, a channel region, and a pair of source/drain regions. At least a portion of at least one of a) the channel region and b) at least one of the source/drain regions is received within the epitaxially-grown silicon-comprising material.

Other aspects and implementations are contemplated.

BRIEF DESCRIPTION OF THE DRAWINGS

Preferred embodiments of the invention are described below with reference to the following accompanying drawings.

FIG. 7 is a view of the FIG. 6 substrate at a processing step subsequent to that shown by FIG. 6.

FIG. 23 is a top view of FIG. 22.

FIG. 24 is a view of the FIG. 22 substrate at a processing step subsequent to that shown by FIG. 22, and taken through line 24-24 in FIG. 25.

FIG. 29 is a top view of FIG. 28.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
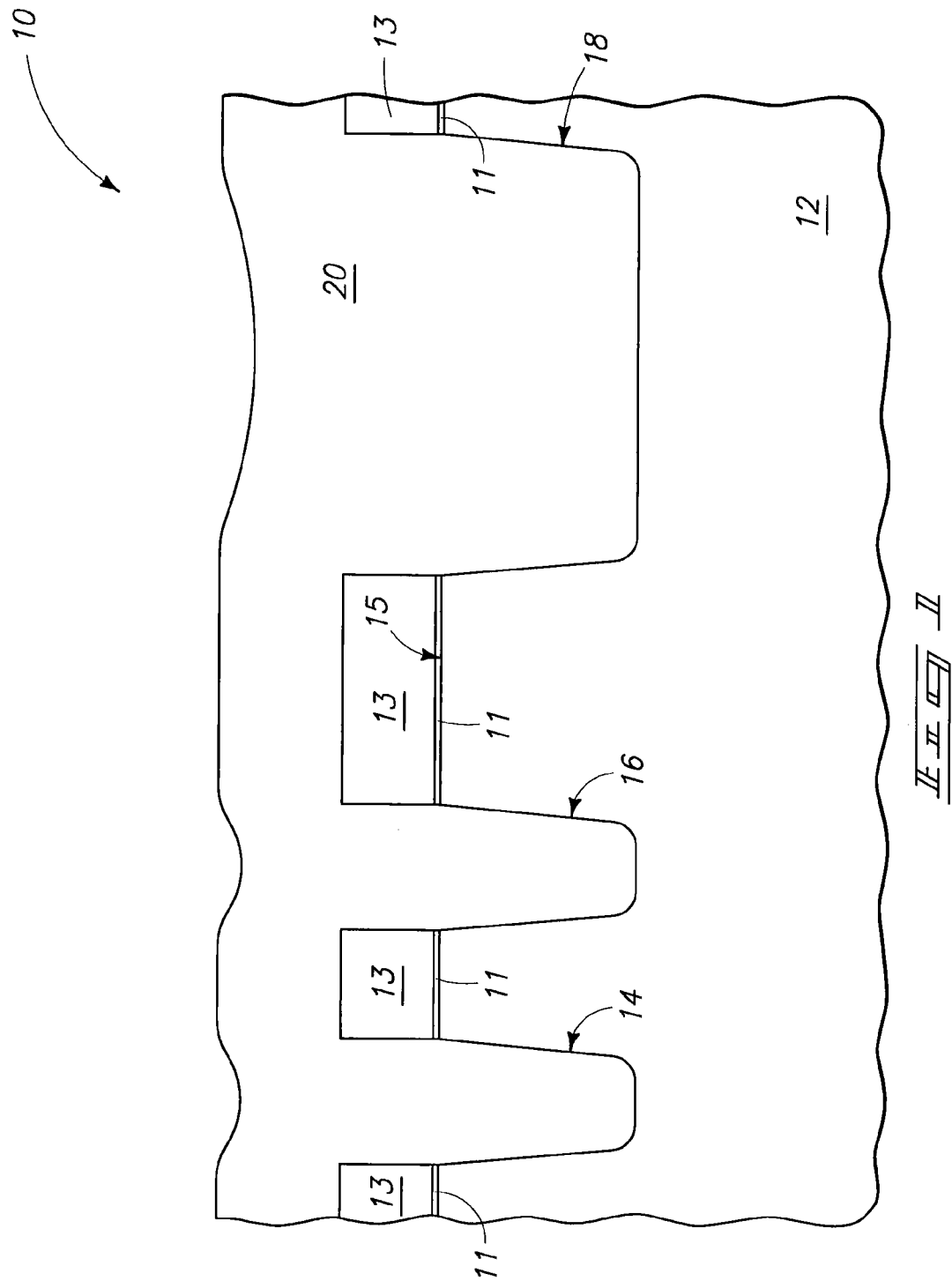
FIG. 1 is a diagrammatic sectional view of a semiconductor substrate in process in accordance with an aspect of the invention.

Various exemplary preferred implementations of methods of forming a field effect transistor, as well as integrated circuitry formed independent of the method of fabrication, are described with reference to FIGS. 1-29. Referring initially to FIG. 1, a fragment of a semiconductive substrate is indicated generally with reference numeral 10. Such comprises bulk semiconductive material 12, which is preferably a bulk semiconductive silicon-comprising material. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An exemplary preferred material 12 includes a lightly p-doped monocrystalline silicon wafer. The preferred bulk semiconductive silicon-comprising material might include one or more other elements, for example a silicon-germanium mixture and by way of example only. Further, bulk semiconductive material 12 might include one or more localized or more global dopant wells formed therein. Bulk semiconductive silicon-comprising material 12 comprises an outermost surface 15, which in the depicted preferred embodiment is essentially planar although of course is not required.

A pad oxide layer 11 and a silicon nitride-comprising masking material 13 are formed over, and preferably on, outermost surface 15 (with "on" in the context of this document meaning in at least some direct physical, touching contact therewith). A series of isolation trenches 14, 16 and 18 have been formed within bulk semiconductive silicon-comprising material 12, preferably by etching using the silicon nitride-comprising masking material 13 and pad oxide layer 11 as a mask. Isolation trenches 14 and 16 can be considered as a pair of adjacent isolation trenches, as can isolation trenches 16 and 18. By way of example only, isolation trenches 14 and 16 might comprise part of an array area of circuitry, for example a memory array, whereas isolation trench 18 might constitute a separation region for or part of peripheral circuitry to an array of circuitry within which isolation trenches 14 and 16 are received. Isolation trenches 14, 16 and 18 might be formed by any existing of yet-to-be developed methods, for example utilizing photolithographic patterning and etch, and/or using the depicted nitride and pad oxide masking layers. Preferably, isolation trenches 14, 16 and 18 comprise shallow trench isolation (STI), with an exemplary trench depth being from surface 15 being from 1,500 Angstroms to 3,000 Angstroms.

Electrically insulative trench isolation material 20 has been formed within isolation trenches 14, 16 and 18. Such might comprise one or more insulative materials. For example and by way of example only, such might comprise a silicon nitride trench lining having a thermal silicon dioxide layer grown before or after deposition of the silicon nitride lining, and a majority silicon dioxide or other fill thereover, for example deposited by high density plasma deposition or as a spin-on-dielectric.

Figure 2:
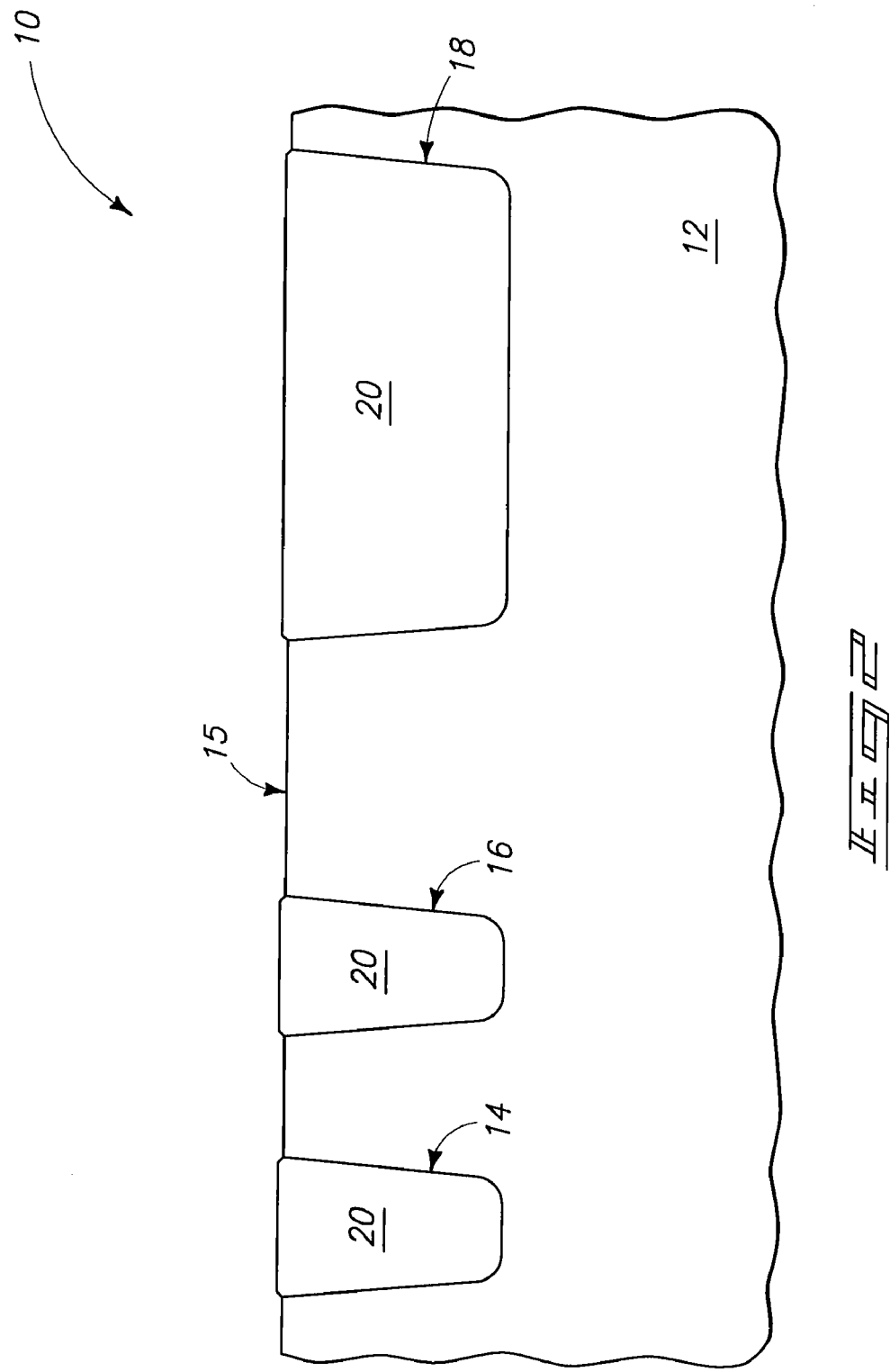
FIG. 2 is a view of the FIG. 1 substrate at a processing step subsequent to that shown by FIG. 1.

Referring to FIG. 2, materials 11, 13 and 20 have been polished back. Thereby in this example, silicon nitride-comprising masking material 13 has been removed from over outermost surface 15. An exemplary preferred technique is by chemical mechanical polishing.

Figure 3:
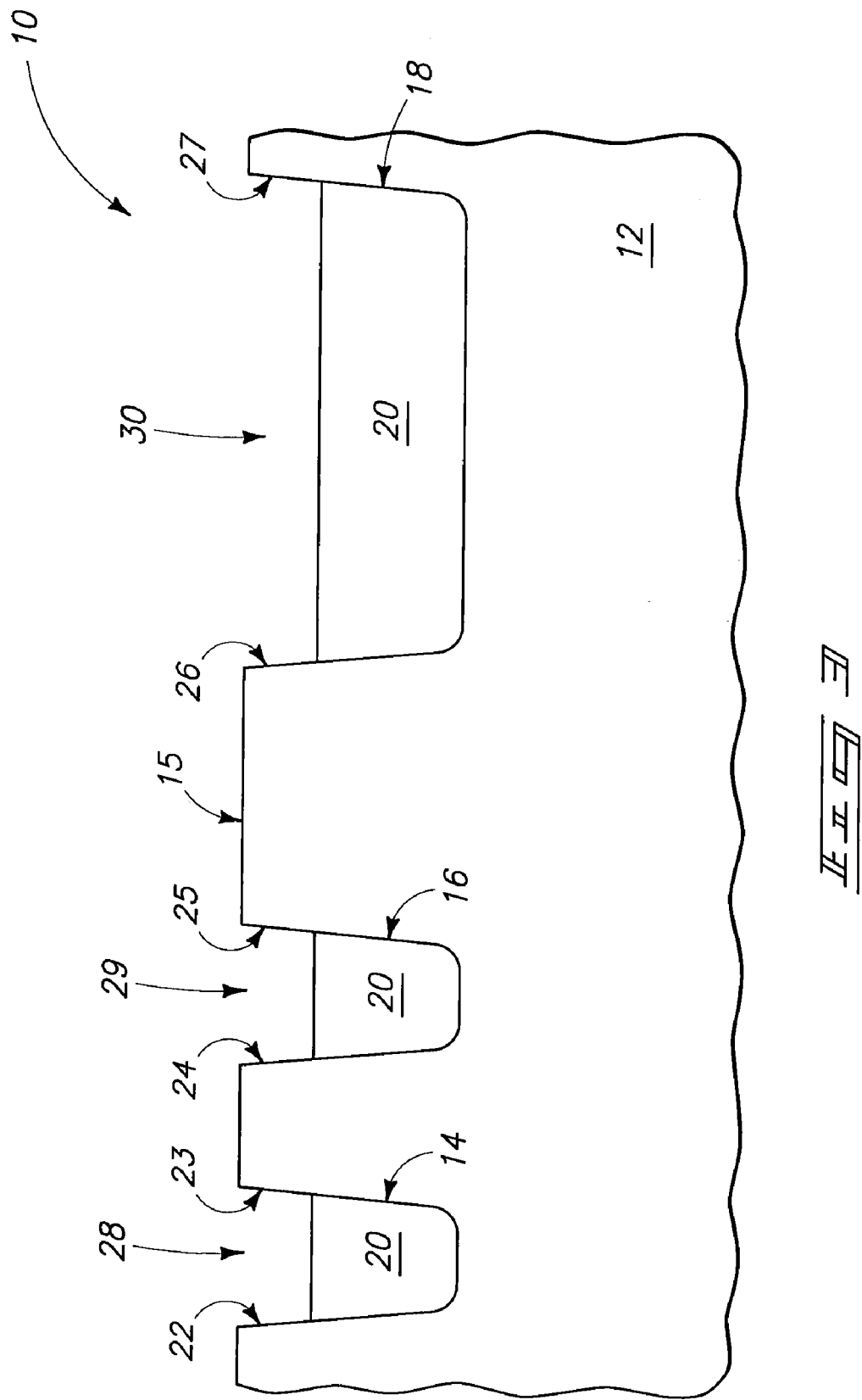
FIG. 3 is a view of the FIG. 2 substrate at a processing step subsequent to that shown by FIG. 2.

Referring to FIG. 3, trench isolation material 20 has been etched effective to recess it relative to outermost surface 15 and thereby expose sidewalls 22, 23, 24, 25, 26 and 27 of bulk semiconductive silicon-comprising material 12. Accordingly by way of example only, sidewalls 23 and 24 are of bulk semiconductive silicon-comprising material 12 between isolation trenches 14 and 16, and sidewalls 25 and 26 are of bulk semiconductive silicon-comprising material 12 between isolation trenches 16 and 18. Such etching forms the depicted recesses 28, 29 and 30 within bulk semiconductive silicon-comprising material 12 relative to outermost surface 15 over trench isolation material 20 received within the respective isolation trenches. An exemplary preferred depth for the recesses from outermost surface 15 is at least 200 Angstroms, more preferably at least 500 Angstroms, and even more preferably at least 700 Angstroms, with a preferred range being from 700 Angstroms to 1,500 Angstroms deep from outermost surface 15. Exemplary preferred manners of etching the depicted trench isolation material 20, where such predominately comprises silicon dioxide, includes a wet hydrofluoric acid etch, a buffered oxide etch (i.e., $NH_3F$) or a suitable dry reactive ion etch.

Figure 4:
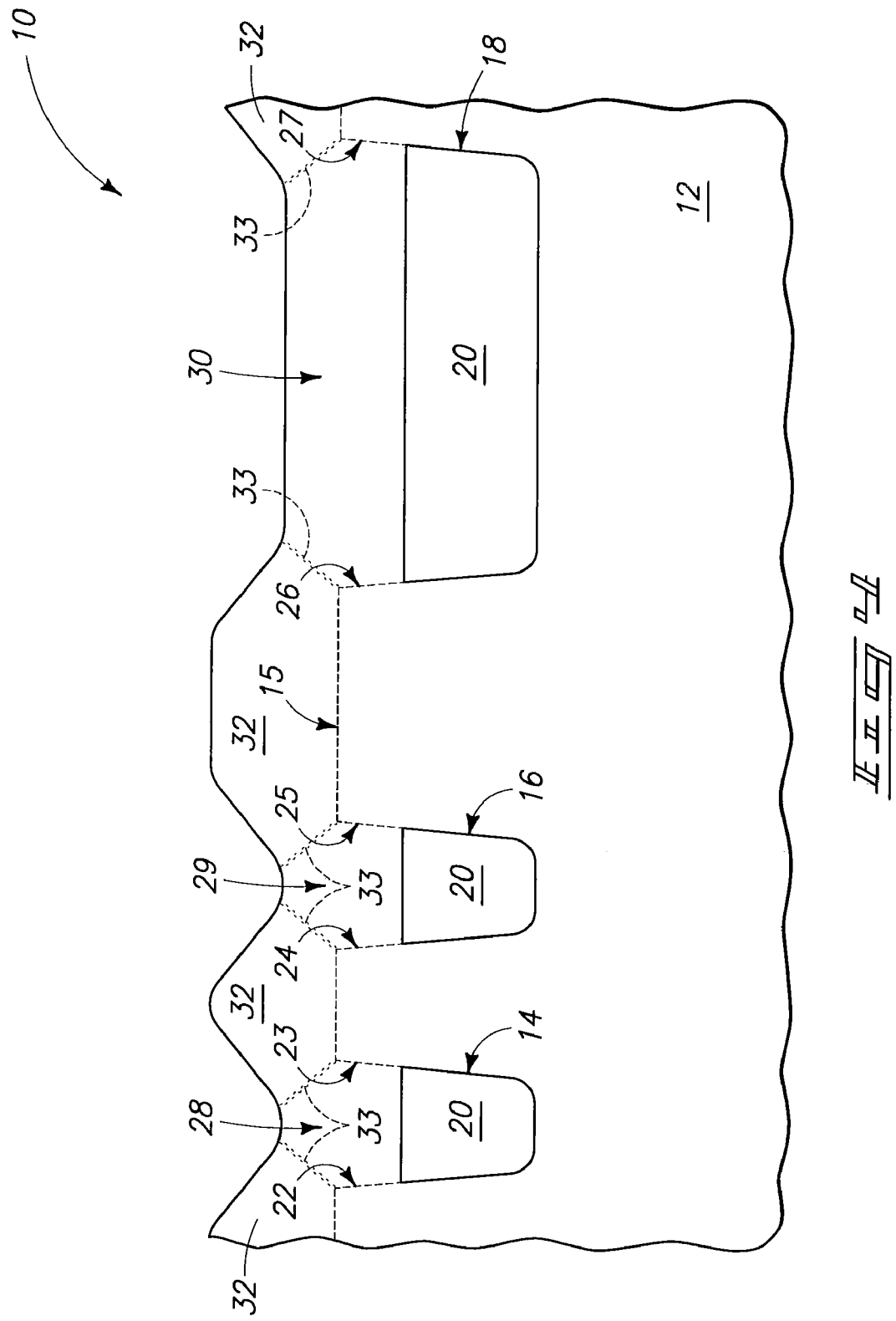
FIG. 4 is a view of the FIG. 3 substrate at a processing step subsequent to that shown by FIG. 3.

Referring to FIG. 4, epitaxially-grown silicon-comprising material has been grown from exposed sidewalls 22, 23, 24, 25, 26 and 27 effective to form epitaxially-grown silicon-comprising material 32 within isolation trenches 28, 29 and 30. In the depicted exemplary embodiment where outer surface 15 of bulk semiconductive silicon-comprising material is exposed, epitaxially-grown silicon-comprising material 32 has also been grown therefrom. Further in the depicted exemplary embodiment, the growing has been effective to completely fill recesses 28, 29 and 30, and also has formed exemplary crystalline stacking faults 33 in part/portions of epitaxially-grown silicon-comprising material 32, although neither of such is required in certain implementations of the invention. For example, such stacking faults, of course, may or may not form, with the depicted exemplary faults propagating elevationally outward from proximate outermost surface 15 from the depicted corners of bulk semiconductive material 12 where the isolation trenches are defined. It has been demonstrated that such stacking faults can be eliminated/prevented from forming in the first place where at least silicon nitride-comprising masking material 13, and preferably pad oxide 11, are removed prior to growth. Such is shown by way of example only in FIG. 5 with respect to a substrate fragment 10*z*. Like numerals from the first described embodiment have been utilized where appropriate, with differences being indicated with the suffix "z". Accordingly in one implementation, the epitaxial silicon-comprising material is void of stacking faults upon its growth.

Figure 5:
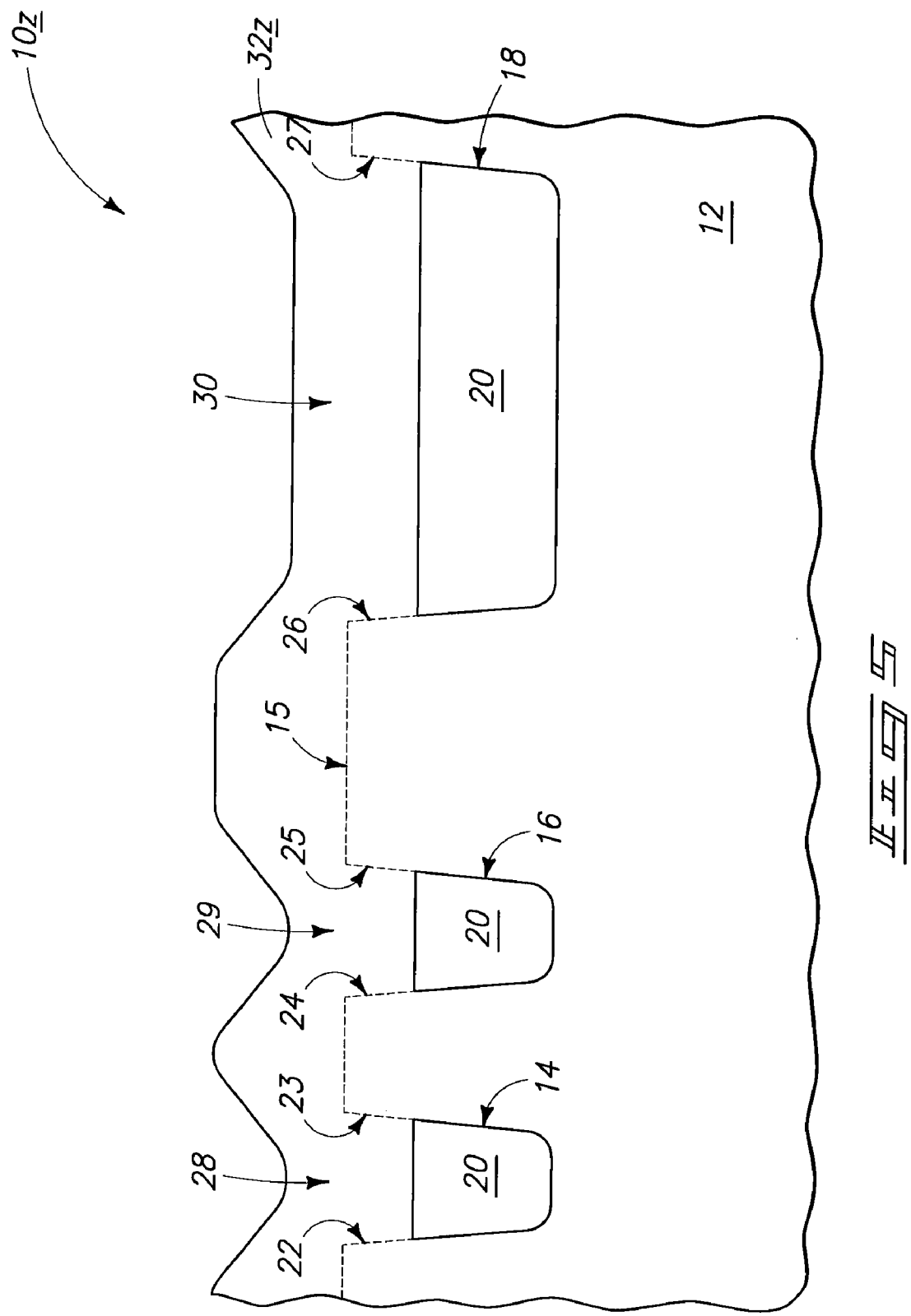
FIG. 5 is a diagrammatic sectional view of an alternate embodiment semiconductor substrate in process in accordance with an aspect of the invention.

Referring to FIGS. 4 and 5, exemplary preferred epitaxially-grown silicon-comprising material 32/32*z* includes a layer comprising, consisting essentially of, or consisting of monocrystalline silicon. Other materials might of course be encompassed, for example a silicon-germanium mixture/alloy. An exemplary preferred process for forming epitaxially-grown silicon-comprising material 32/32*z* includes a low pressure chemical vapor deposition process at an exemplary temperature from 500° C. to 1000° C., an exemplary pressure from $10^{-7}$ Torr to 100 Torr and exemplary gas feeds of silane or dichlorolsilane, $Cl_2$, HCl and $H_2$, with such an exemplary process preferably not forming stacking faults 33. A specific exemplary process includes, in an Applied Materials Centura Processor, a substrate temperature of 850° C., a chamber pressure of 40 Torr, dichlorosilane flow of 0.235 sccm, HCl flow of 166 sccm and $H_2$ flow at 14 slm.

Figure 6:
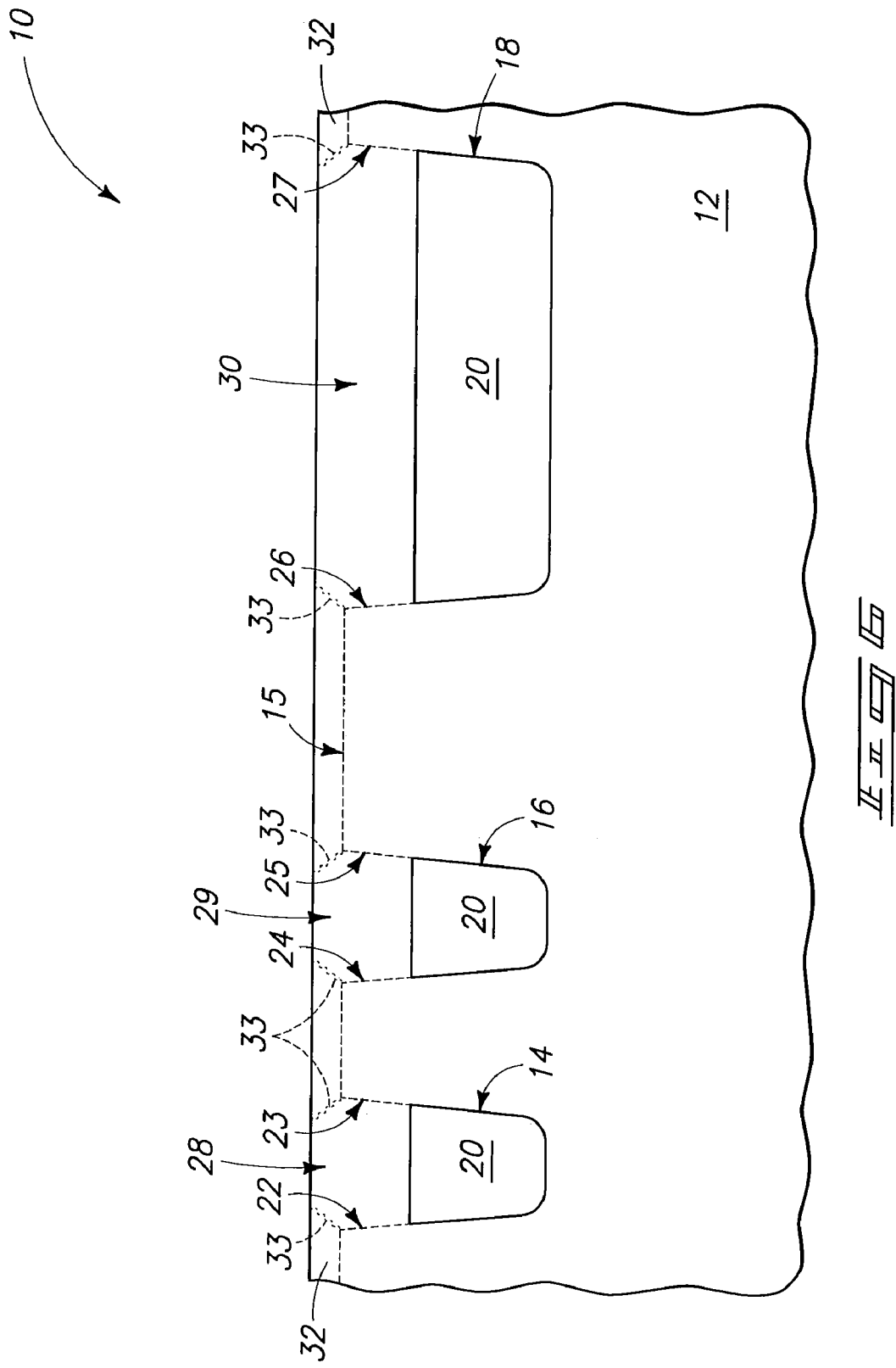
FIG. 6 is a view of the FIG. 4 substrate at a processing step subsequent to that shown by FIG. 4.

Referring to FIG. 6, epitaxially-grown silicon-comprising material 32 has been planarized, for example by chemical mechanical polishing. Stacking faults may or may not exist in the planarized layer in part depending upon whether such were formed in the growth process of FIG. 4, and where such do occur, and to the degree of material 32 removal. Material 32 might be removed to a point elevationally outward of outermost surface 15 (as shown), to a point at about surface 15 (not shown), or to a point below surface 15 (not shown).

Referring to FIG. 7, exemplary field effect transistors 34 and 36 have been formed. In the depicted exemplary embodiment, epitaxially-grown silicon-comprising material 32 has been patterned, and electrically insulative isolation regions 38 have been formed therebetween. An exemplary preferred material is doped or undoped silicon dioxide. Field effect transistors 34 and 36 are depicted as comprising respective gates 40, 41; channel regions 42, 43; and source/drain regions 44, 46 and 45, 47. A suitable gate dielectric layer 48 separates the conductive gates from the respective channel regions. Conductive gates 40, 41 might comprise one or a combination of conductively doped semiconductive, metal, and metal compound materials. Insulative caps and spacers might also, of course, be provided. The depicted source/drain regions can be formed by suitable ion implant doping, by way of example only.

In one implementation of an aspect of the invention, at least a portion of a) at least one of the channel region and b) at least one of the source/drain regions is received within epitaxially-grown silicon-comprising material 32. In the depicted exemplary FIG. 7 embodiment, portions of the respective channel regions and both source/drain regions of each depicted transistor are received within epitaxially-grown silicon-comprising material 32. In field effect transistor 36, clearly all of channel region 43 and all of both source/drain regions 45 and 47 of such pair of source/drain regions are received within epitaxially-grown silicon-comprising material 32 over trench isolation material 20 of isolation trench 18.

In one aspect or implementation, a method of forming a field effect transistor includes, where crystalline stacking faults are formed, removing part of the epitaxially-grown silicon-comprising material effective to remove the crystalline stacking faults prior to forming that portion of the channel region and/or source/drain regions which are formed or received within the epitaxially-grown silicon-comprising material. For example in the exemplary depicted FIG. 7 embodiment, the stacking faults 33 appearing in FIG. 4 relative to isolation trench 18 have effectively been removed such that such do not appear in field effect transistor 36. Field effect transistor 34 depicts some of stacking faults 33 remaining, although such might not be formed in the first place, thereby not existing in transistor 34.

Figure 8B:
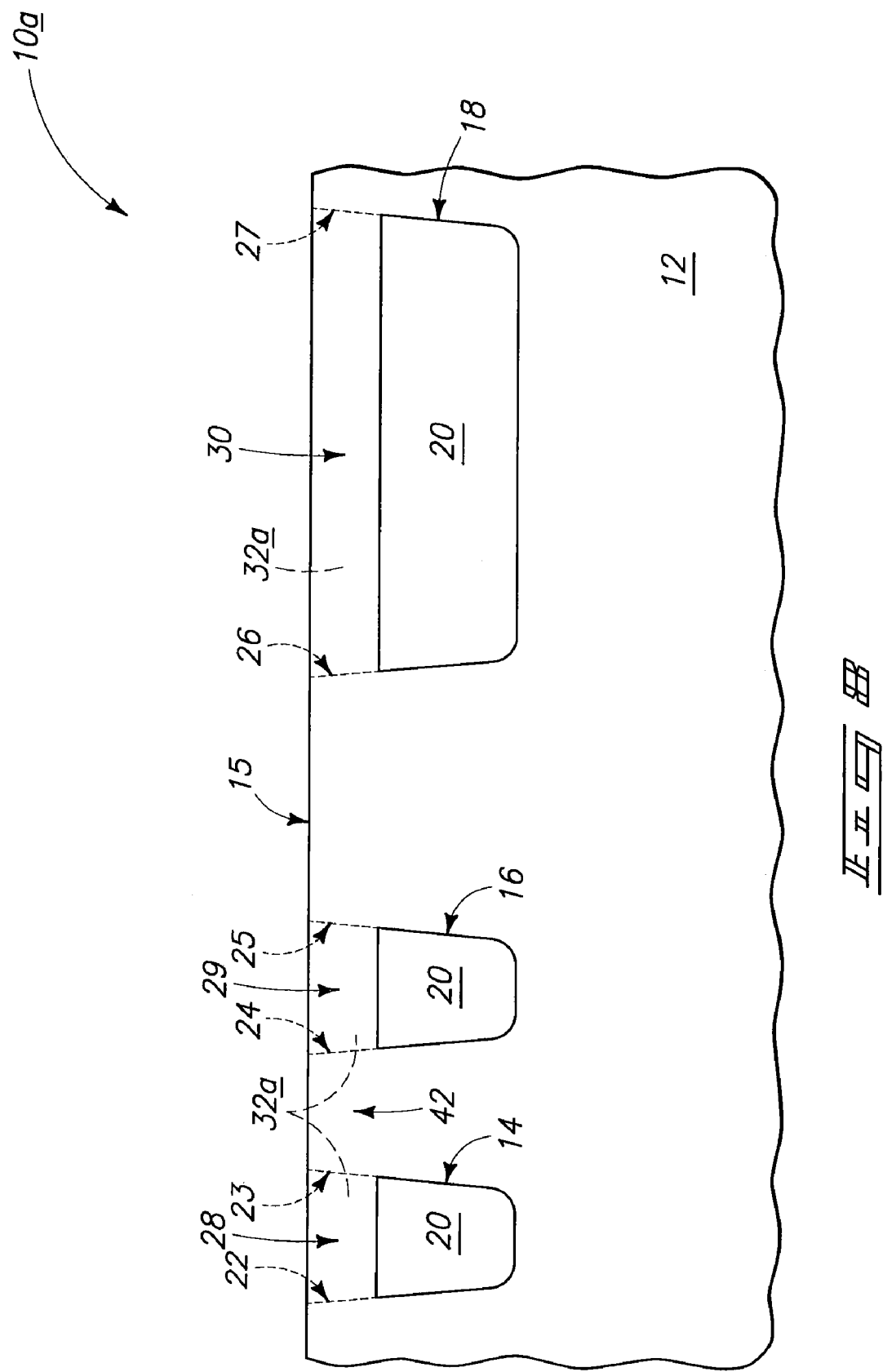
FIG. 8 is a diagrammatic sectional view of an alternate embodiment semiconductor substrate in process in accordance with an aspect of the invention.
Figure 9:
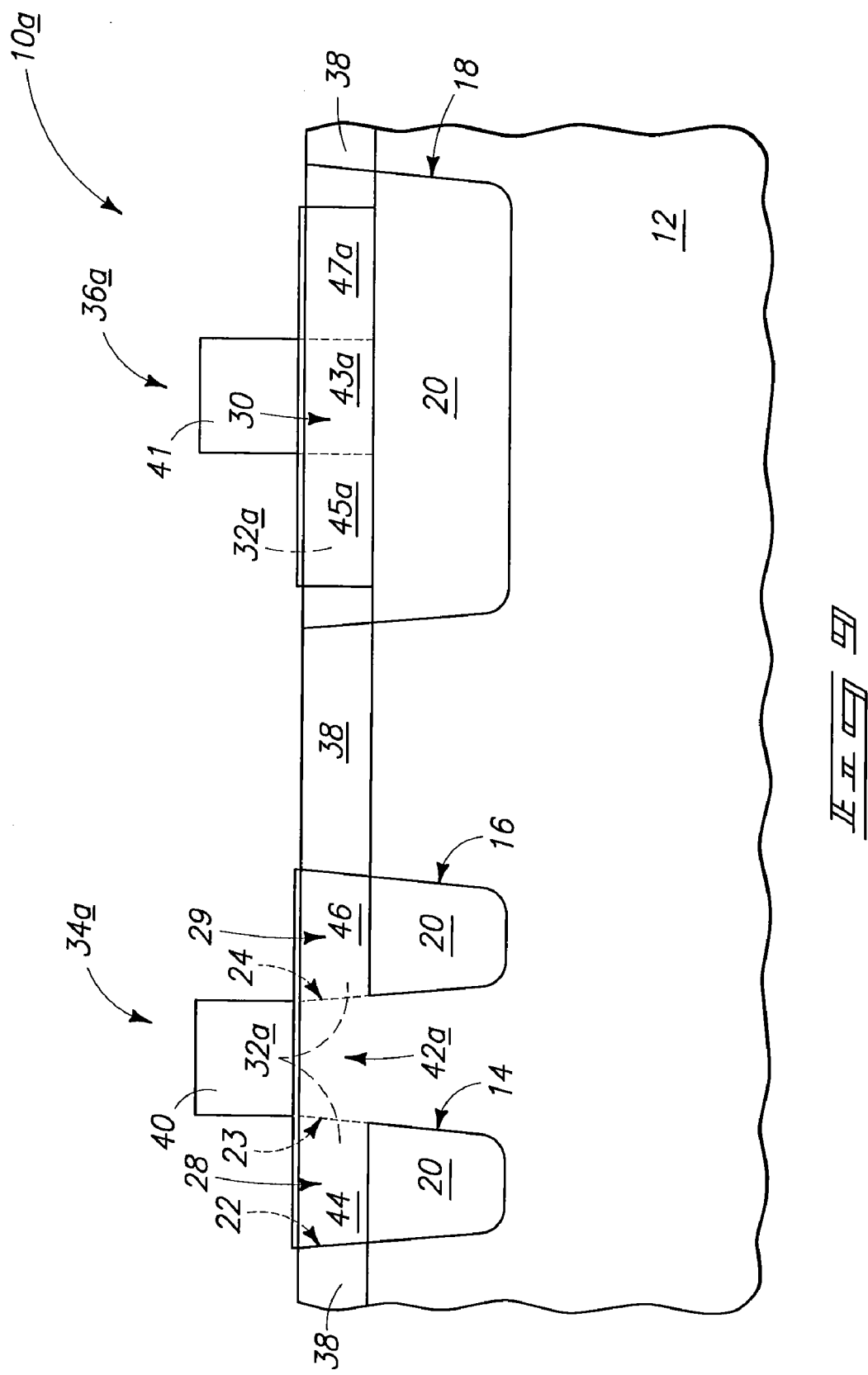
FIG. 9 is a view of the FIG. 8 substrate at a processing step subsequent to that shown by FIG. 8.

By way of example only, FIGS. 8 and 9 depict an alternate embodiment substrate fragment 10a. Like numerals from the first-described embodiment have been utilized where appropriate, with differences being indicated with the suffix "a". FIG. 8 depicts an alternate processing to that shown by FIG. 6. Specifically in FIG. 8, epitaxially-grown silicon-comprising material 32 has been removed at least to bulk semiconductive silicon-comprising material outermost surface 15, leaving epitaxially-grown silicon-comprising material 32a within recesses 28, 29 and 30. Such processing thereby removes all of the depicted stacking faults as shown in FIG. 4.

FIG. 9 depicts resultant transistors 34a and 36a. Such also depicts, by way of example only, an exemplary embodiment where none of channel region 42a of transistor 34a is formed within epitaxially-grown silicon-comprising material 32a, rather being formed within bulk semiconductive silicon-comprising material 12.

Figure 10:
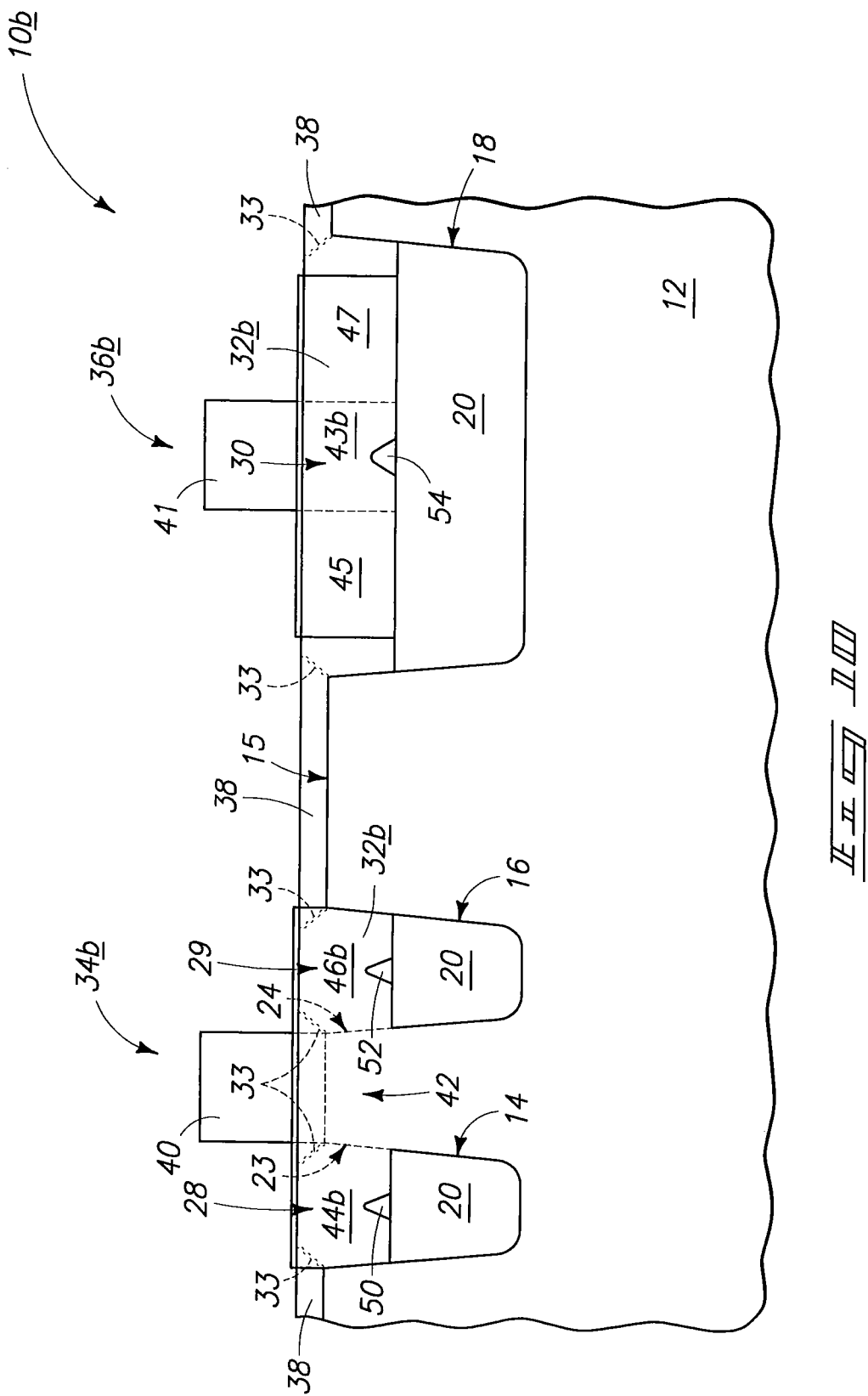
FIG. 10 is a diagrammatic sectional view of another alternate embodiment semiconductor substrate in accordance with an aspect of the invention.

Referring to FIG. 10, an alternate exemplary semiconductor wafer fragment 10b is depicted. Like numerals from the first-described embodiment have been utilized where appropriate, with differences being indicated with the suffix "b" or with different numerals. FIG. 10 depicts an exemplary embodiment whereby epitaxially-grown silicon-comprising material has been grown from the exposed sidewalls effective to fill only a portion of recesses 28, 29 and 30, leaving respective voids 50, 52 and 54 within the depicted recesses which are covered by epitaxially-grown silicon-comprising material 32b and with such voids extending to insulative trench isolation material 20. Void formation can be induced by factors including deposition thickness, pressure, and temperature. For example, the wider the isolation oxide, the higher the pressure and the slower the rate of growth, the less likely voids would be formed. Of course where voids are desired, lower pressure and faster growth rate favorably increase the degree of void formation. Further of course, voids might be formed in any of the other embodiments described above and elsewhere herein.

The methods described herein might be utilized to fabricate any conceivable field effect transistor, and aspects of the invention also include integrated circuitry incorporating field effect transistors independent of the method of fabrication. For example and by way of example only, FIG. 10 depicts integrated circuitry incorporating field effect transistors 34b, 36b, individually comprising a gate, a channel region, and a pair of source/drain regions. At least a portion of at least one of a) the channel region and b) at least one of the source/drain regions is received within the semiconductor material over the insulative material, with such portion comprising a void received within the semiconductor material and extending to the insulative material.

Figure 11:
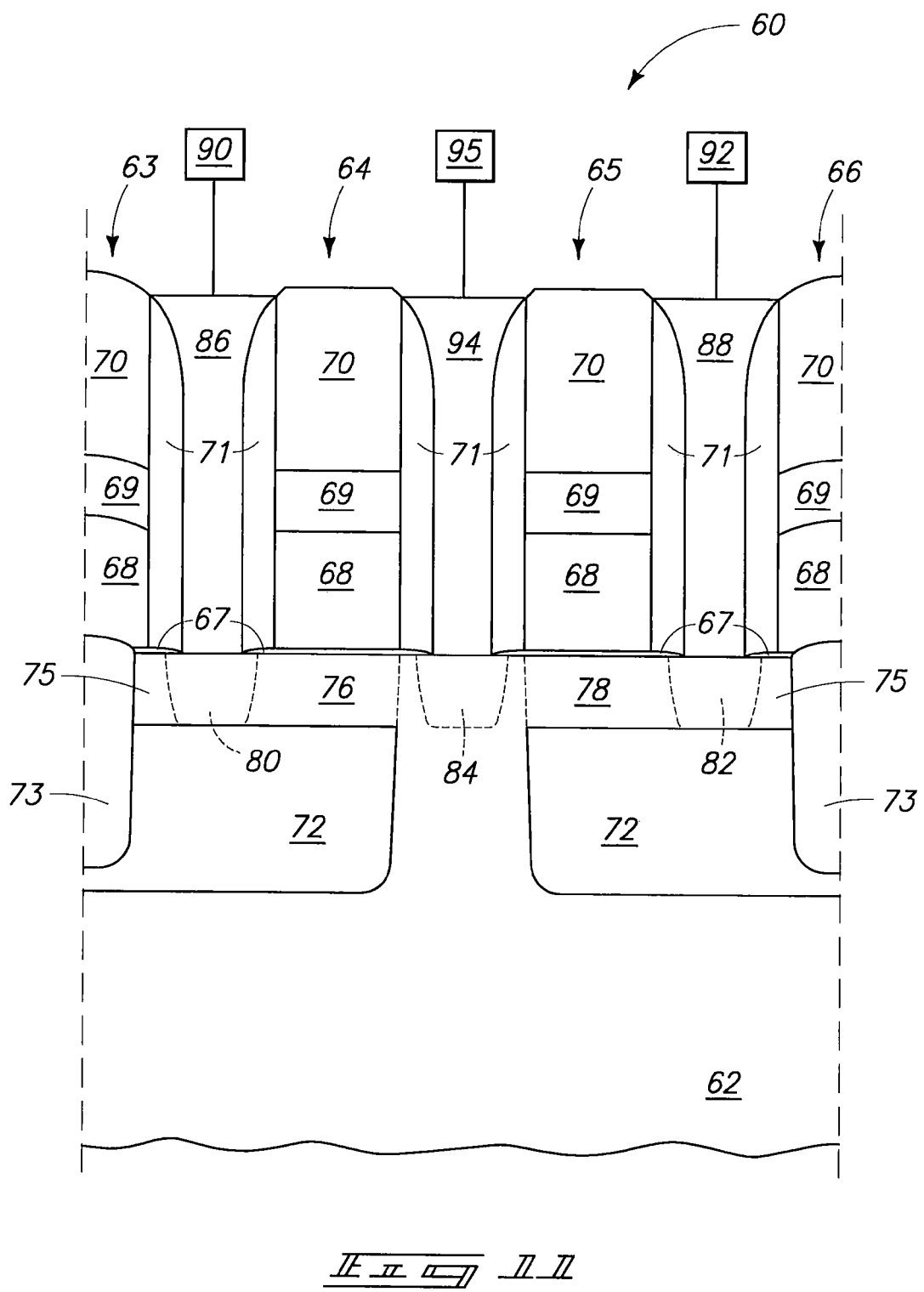
FIG. 11 is a diagrammatic sectional view of another alternate embodiment semiconductor substrate in accordance with an aspect of the invention.

Next, by way of examples only, FIGS. 11, 12, 13 and 14 depict exemplary alternate embodiments of integrated circuitry in fabrication encompassing dynamic random access memory (DRAM). Referring initially to FIG. 11, such depicts an integrated circuit fragment 60 of a semiconductor substrate comprising bulk semiconductive material 62. Alternate substrates are of course contemplated. A series of wordline constructions 63, 64, 65 and 66 are received over bulk semiconductive material 62 (for example preferably of the same composition as material 12 of the first described embodiment). Such comprise a gate dielectric layer 67, conductively doped polysilicon region 68, conductive metal or metal silicide region 69, and insulative caps 70. Electrically insulative sidewall spacers 71 are received about the respective wordlines as shown.

Electrically insulative material 72 is depicted as being received within bulk semiconductive material 62. Preferably, material 72 comprises electrically insulative trench isolation material, for example fabricated as described above. Another insulative trench material 73, which might be the same or different from material 72, is shown for isolating from adjacent other devices not depicted in FIG. 11.

A semiconductor material 75 has been formed on insulative material 72. An exemplary preferred material 75 is epitaxially-grown silicon, for example of a composition and formed in the manners of circuitry fabrication described above. Semiconductor material 75 might include other materials such as germanium, and regardless might be of the same or different composition from that of semiconductive material 62. Channel regions 76 and 78 are depicted as being received beneath wordline constructions 64 and 65, respectively, within semiconductor material 75, as are a source/drain region 80 associated with wordline 64 and a source/drain region 82 associated with wordline 65 and within semiconductor material 75. A exemplary shared source/drain region 84 is depicted as being received within bulk semiconductive material 62 between wordline constructions 64 and 65.

Electrically conductive contacts 86 and 88 extend elevationally outward from source/drain regions 80 and 82, respectively. Such would connect with respective storage node capacitors designated with numerals 90 and 92. A conductive contact 94 extends elevationally outward from shared source/drain region 84 and electrically connects with a bitline 95. In the depicted exemplary circuit, and by way of example only, one field effect transistor comprises wordline gate construction 64, source/drain regions 80 and 84, and channel region 76. Another depicted field effect transistor comprises wordline gate 65, source/drain regions 84 and 82, and channel region 78. In the depicted exemplary FIG. 11 implementation, one of the source/drain regions of a transistor (of course not necessarily all or more than one transistor) is formed in semiconductor material 75 (i.e., source/drain region 80), and the other of the source/drain regions is formed in bulk semiconductive material 62 (i.e., source/drain region 84). Accordingly by way of example only, such depicts all of only one of the source/drain regions of the transistor as being received within semiconductor material 75, for example within epitaxially-grown silicon-comprising material as might be fabricated in accordance with the above-described methods.

Figure 12:
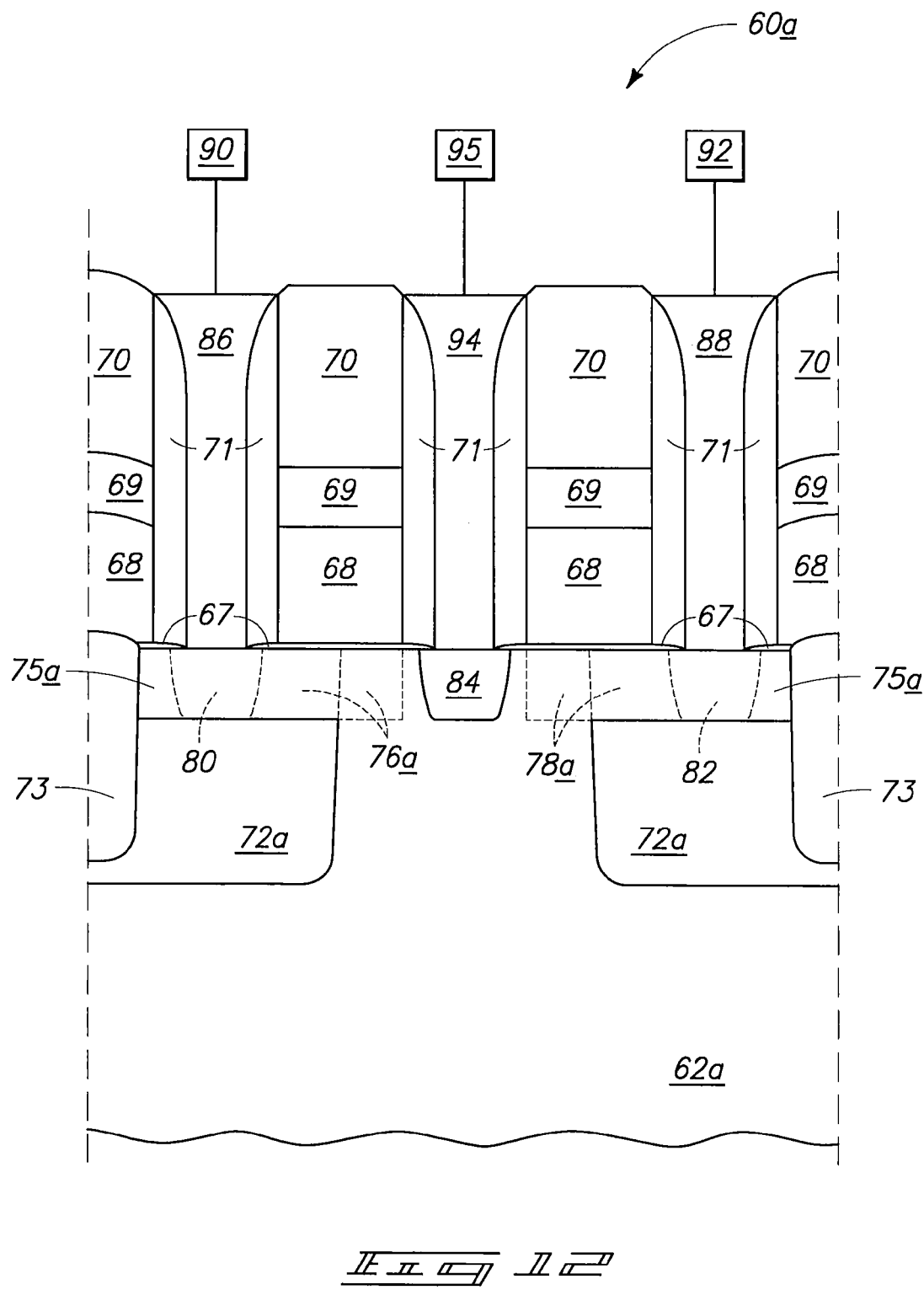
FIG. 12 is a diagrammatic sectional view of another alternate embodiment semiconductor substrate in accordance with an aspect of the invention.

By way of example only, an alternate exemplary embodiment integrated circuit and method of fabrication of a field effect transistor is depicted in FIG. 12 with respect to a semiconductor substrate 60a. Like numerals from the FIG. 11 embodiment have been utilized where appropriate, with differences being indicated with the suffix "a". The integrated circuit of FIG. 12 depicts a field effect transistor wherein the channel region (i.e., channel regions 76a and 78a) is received partially within semiconductor material 75a and partially within bulk semiconductive material 62a. Further and regardless, FIG. 12 depicts one implementation wherein electrically insulative material 72a extends from beneath one of the source/drain regions in a transistor (i.e., source/drain regions 80 or 82) to beneath only a portion of the channel region (i.e., channel regions 76a or 78a). Therefore, and in accordance with the above-described or other methods of forming a field effect transistor, FIG. 12 depicts an implementation whereby at least a part of the channel region is received within the bulk semiconductor silicon-comprising material, for example material 62a, and also an implementation wherein only a part of a channel region is received within epitaxially-grown silicon-comprising material, depicted in the preferred embodiment and by way of example only, as material 75a.

Figure 13:
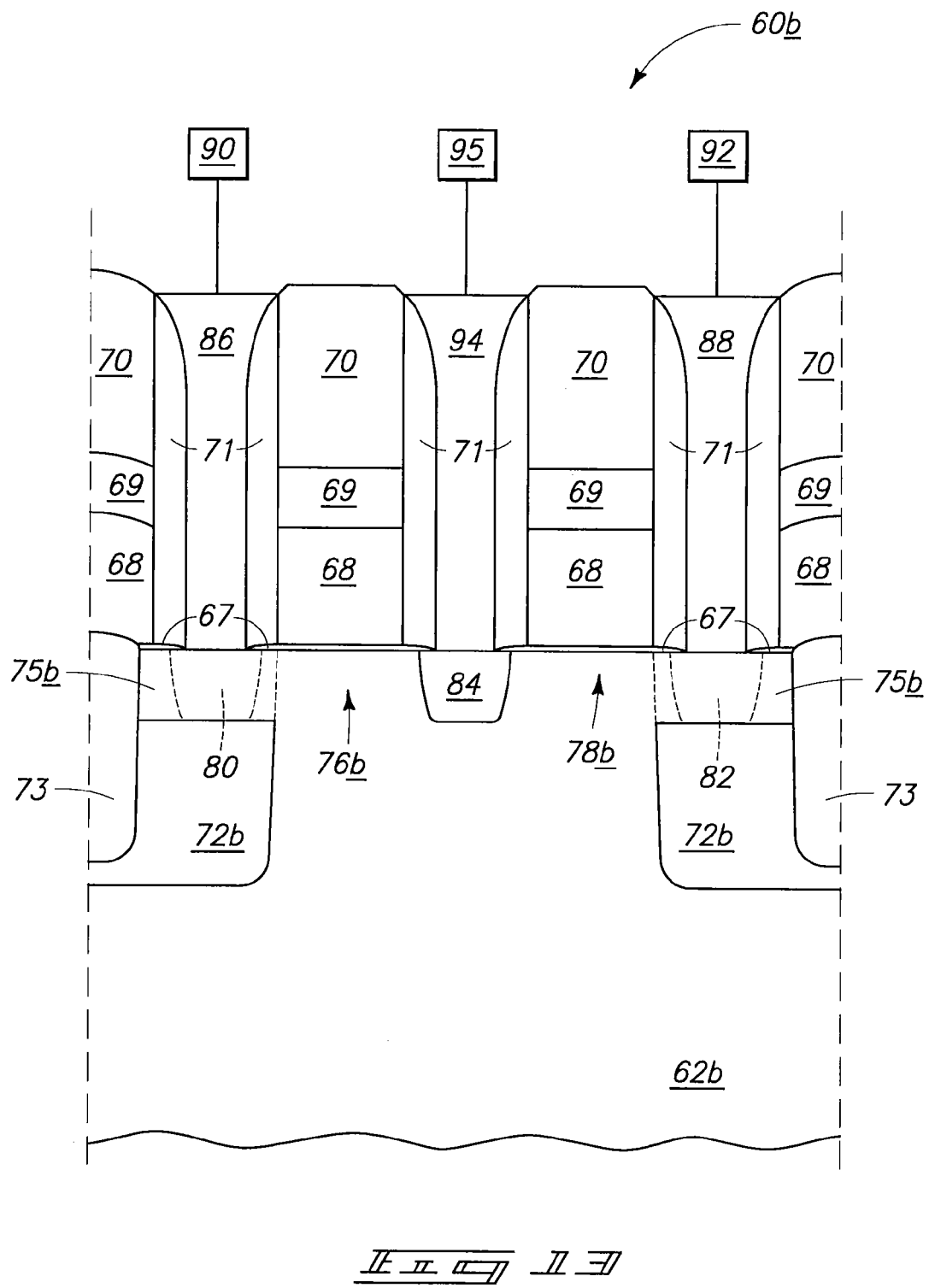
FIG. 13 is a diagrammatic sectional view of another alternate embodiment semiconductor substrate in accordance with an aspect of the invention.

Another alternate embodiment semiconductor substrate 60b is depicted in FIG. 13. Like numerals from the FIG. 11 embodiment are utilized where appropriate, with differences being indicated with the suffix "b". Here, all of channel regions 76b and 78b are received within bulk semiconductive material 62b. Further in the depicted implementation, all of only one of the source/drain regions of each transistor is received within the epitaxially-grown silicon-comprising material, with the other source/drain region (i.e., source/drain region 84) being received within bulk semiconductive material.

Figure 14:
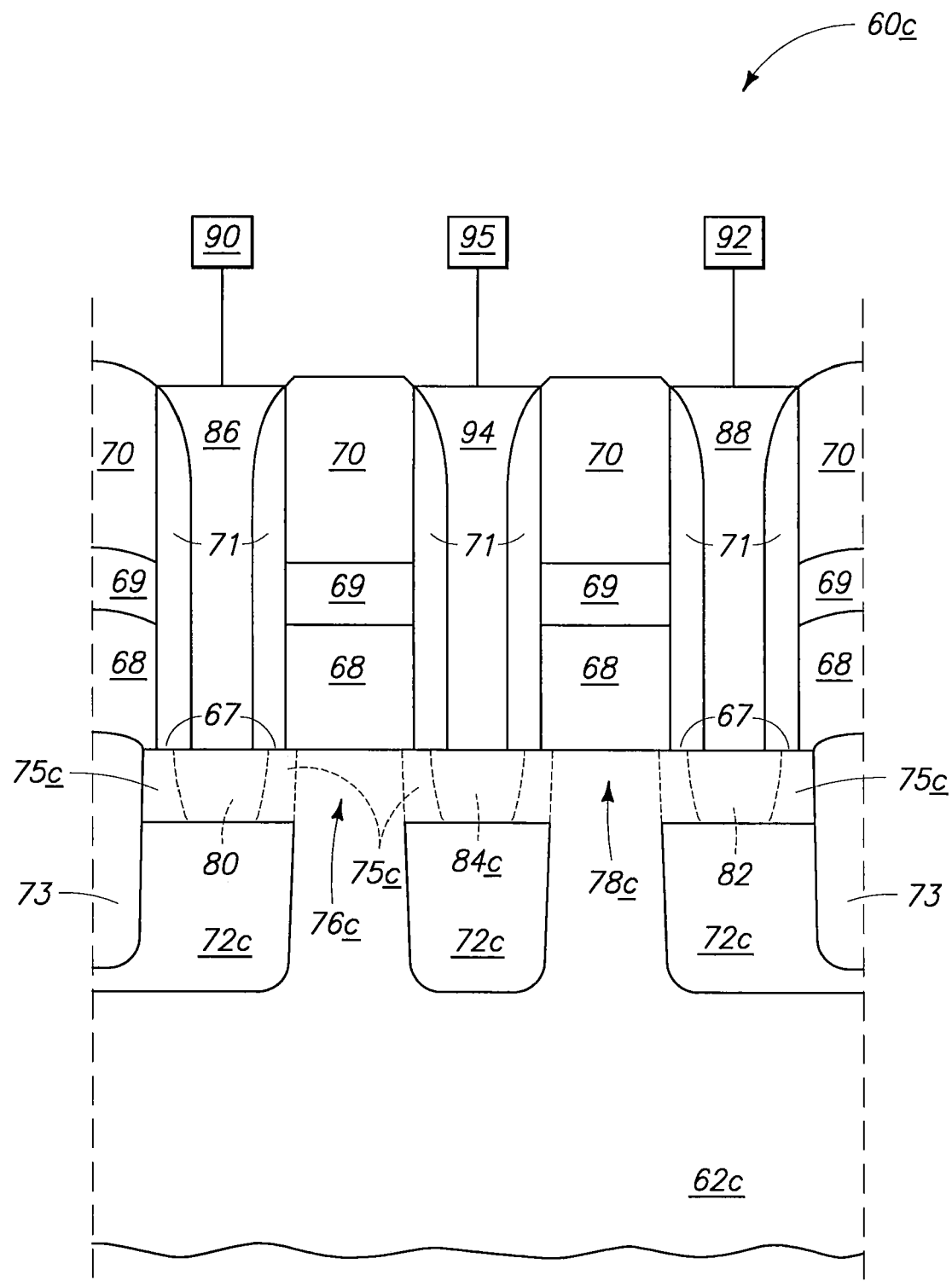
FIG. 14 is a diagrammatic sectional view of another alternate embodiment semiconductor substrate in accordance with an aspect of the invention.

Yet another alternate exemplary embodiment semiconductor substrate 60c is depicted in FIG. 14. Like numerals from the FIG. 11 embodiment are utilized where appropriate, with differences being indicated with the suffix "c". By way of example only, such depicts a pseudo-SOI construction whereby source/drain regions 80, 82 and 84c are formed within semiconductor material/epitaxially-grown silicon-comprising material 75c, and at least some of channel regions 76c and 78c are comprised of bulk semiconductive material and are also shown as comprising some semiconductor material/epitaxially-grown silicon-comprising material 75c.

By way of example only, exemplary methods for fabricating the structure of FIG. 11 are described with reference to FIGS. 15-29. Processing could be modified, of course, to produce any of the other structures of FIGS. 12-14, or other structures, in accordance with aspects of the invention, and of course using other or modified methods.

Figure 15:
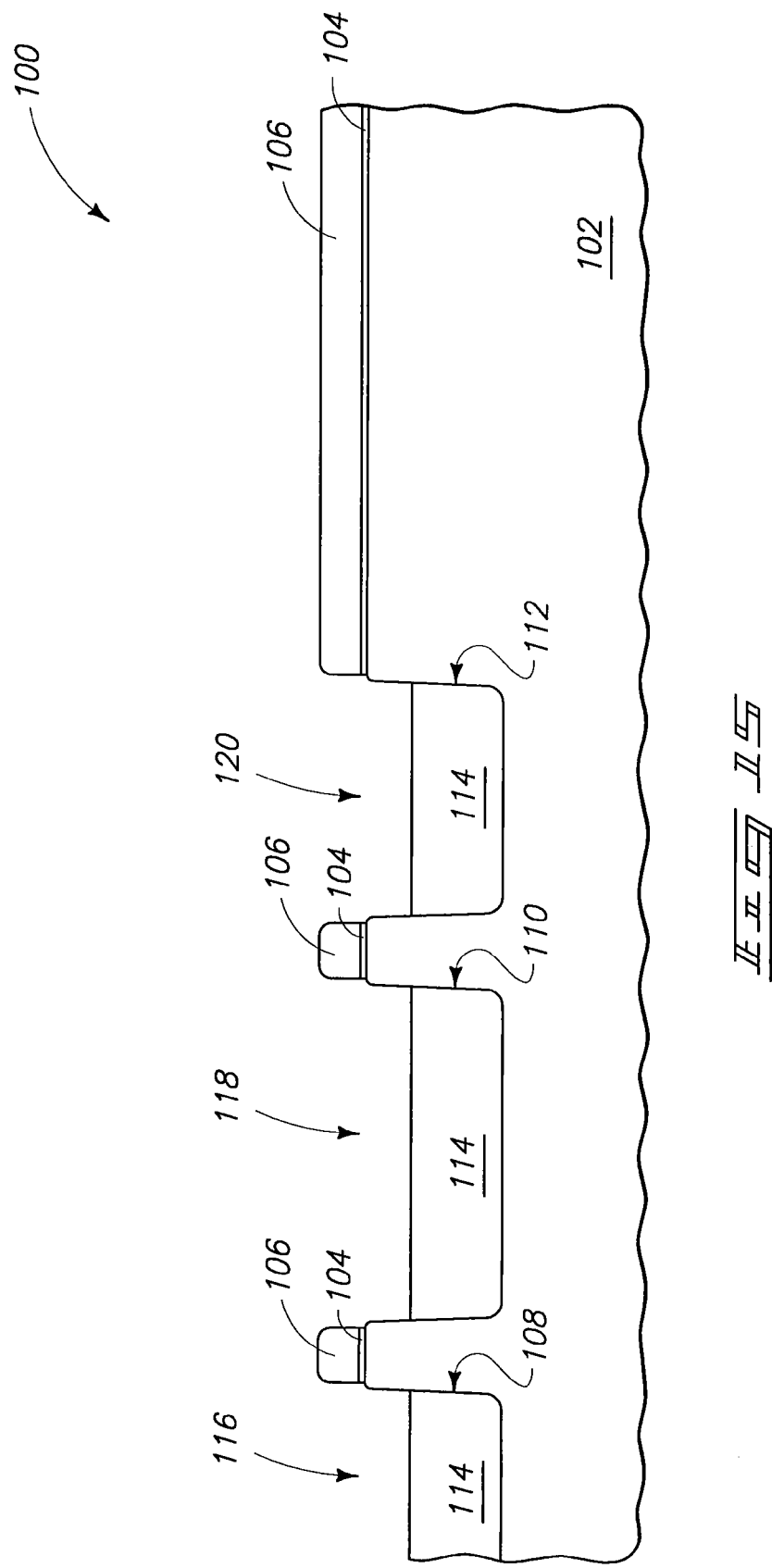
FIG. 15 is a diagrammatic sectional view of another alternate embodiment semiconductor substrate in process in accordance with an aspect of the invention.

Referring initially to FIG. 15, a semiconductor substrate is indicated generally with reference numeral 100. Such comprises bulk semiconductive material 102, for example and by way of example only, bulk monocrystalline silicon. A pad oxide layer 104 and a silicon nitride layer 106 have been formed over bulk semiconductive material 102. Such have been masked and patterned to form a trench isolation mask, whereby exemplary isolation trenches 108, 110 and 112 are formed. Electrically insulative trench isolation material 114 has been formed within isolation trenches 108, 110 and 112. Such has been etched effective to recess it relative to the outermost surface of bulk semiconductive material 102, thereby leaving recesses 116, 118 and 120. Materials and processing, by way of example only, could be as described above in the first-described embodiment. Further by way of example only in this embodiment and at least at this point in the process, silicon-nitride comprising masking material 106 and pad oxide layer 104 remain at least in part over substrate 102.

Figure 16:
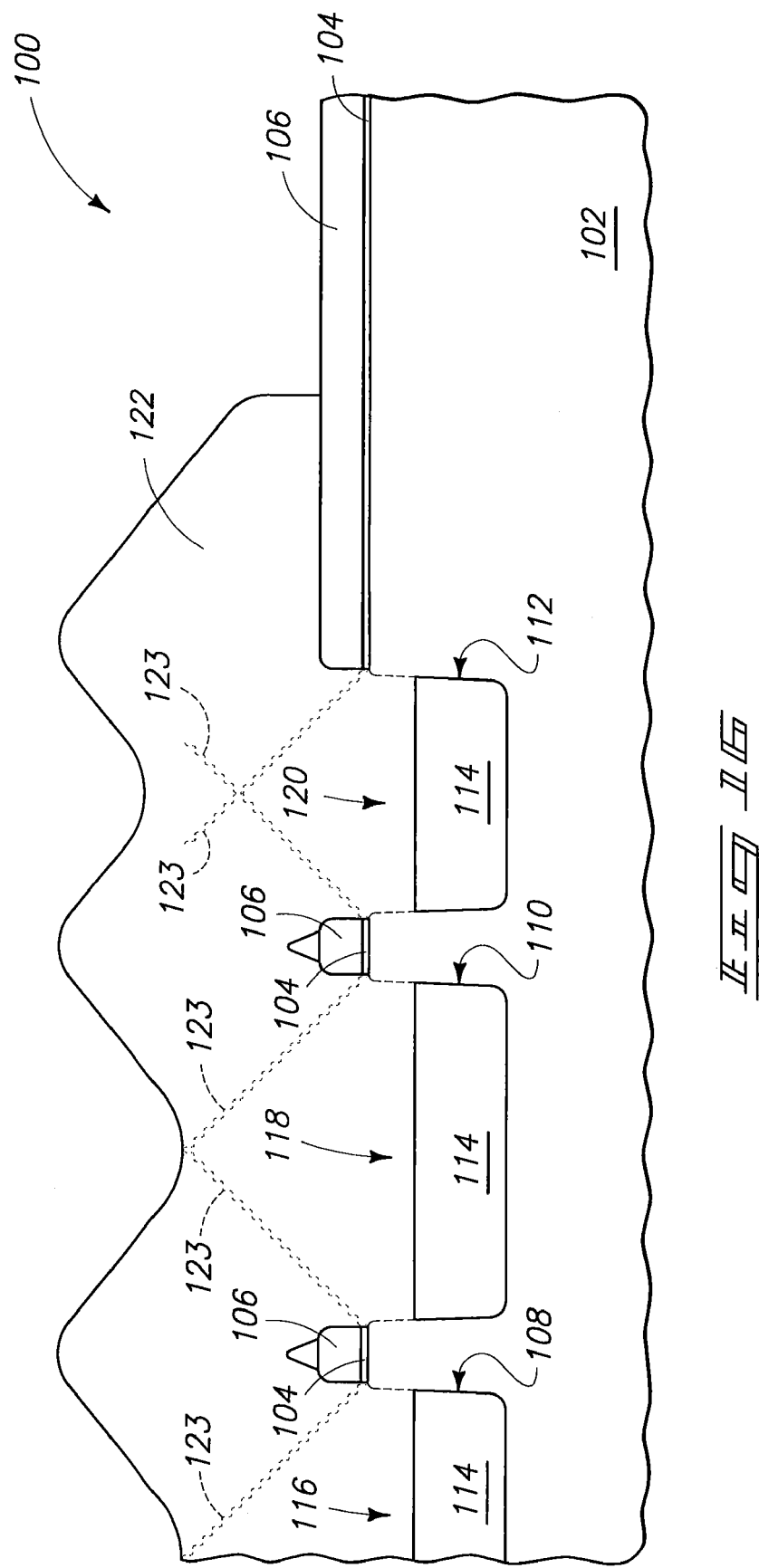
FIG. 16 is a view of the FIG. 15 substrate at a processing step subsequent to that shown by FIG. 15.

Referring to FIG. 16, epitaxially-grown silicon-comprising material 122 has been grown from exposed sidewalls of the trenches effective to form epitaxially-grown silicon-comprising material within such trenches. An exemplarily-grown silicon thickness is 5,000 Angstroms. Likely stacking faults are indicated with numeral 123.

Figure 17:
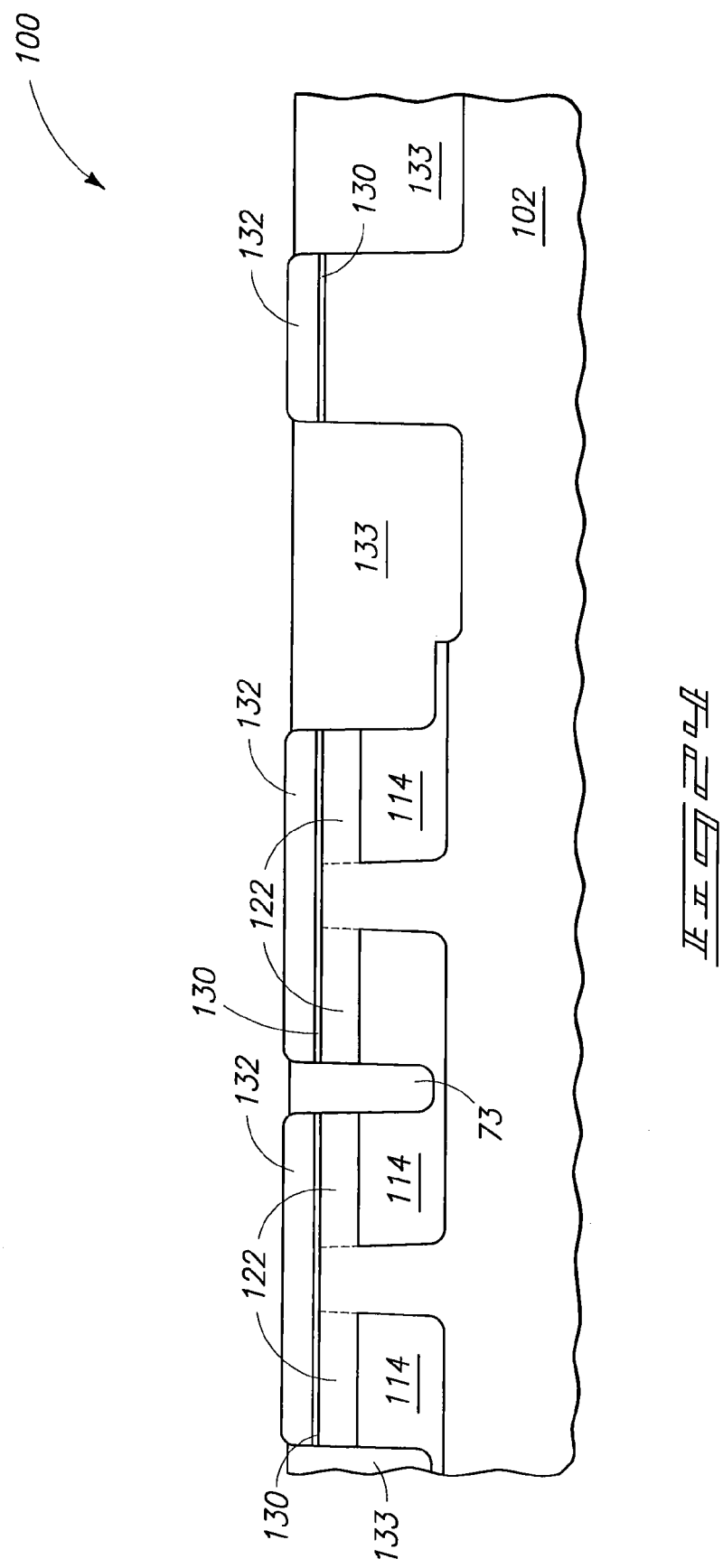
FIG. 17 is a view of the FIG. 16 substrate at a processing step subsequent to that shown by FIG. 16.

Referring to FIG. 17, epitaxially-grown silicon-comprising material 122 has been chemical mechanical polished essentially selective relative to the depicted nitride mask 106. Such might be slightly over-etched/removed, for example over-removed to about 300 Angstroms.

Figure 18:
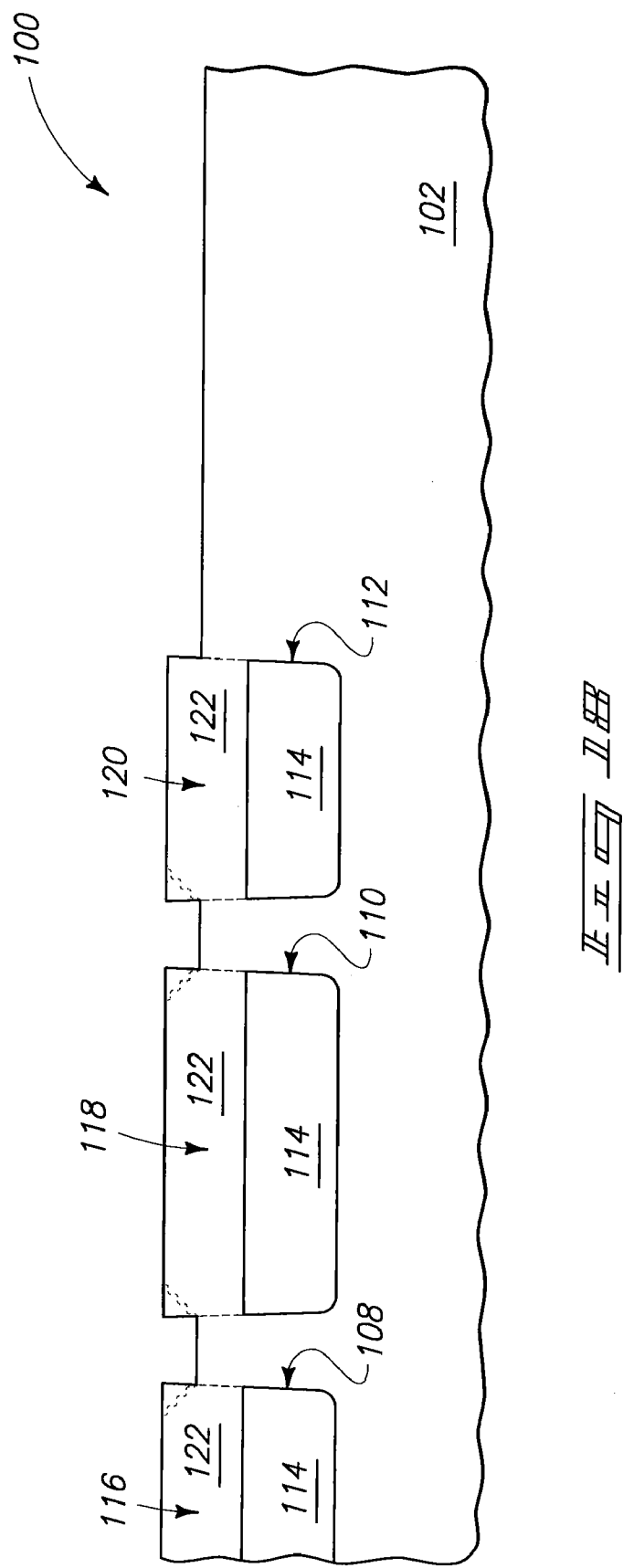
FIG. 18 is a view of the FIG. 17 substrate at a processing step subsequent to that shown by FIG. 15.

Referring to FIG. 18, masking nitride 106 and pad oxide 104 have been removed. Preferred processing is by any suitable wet etching.

Figure 19:
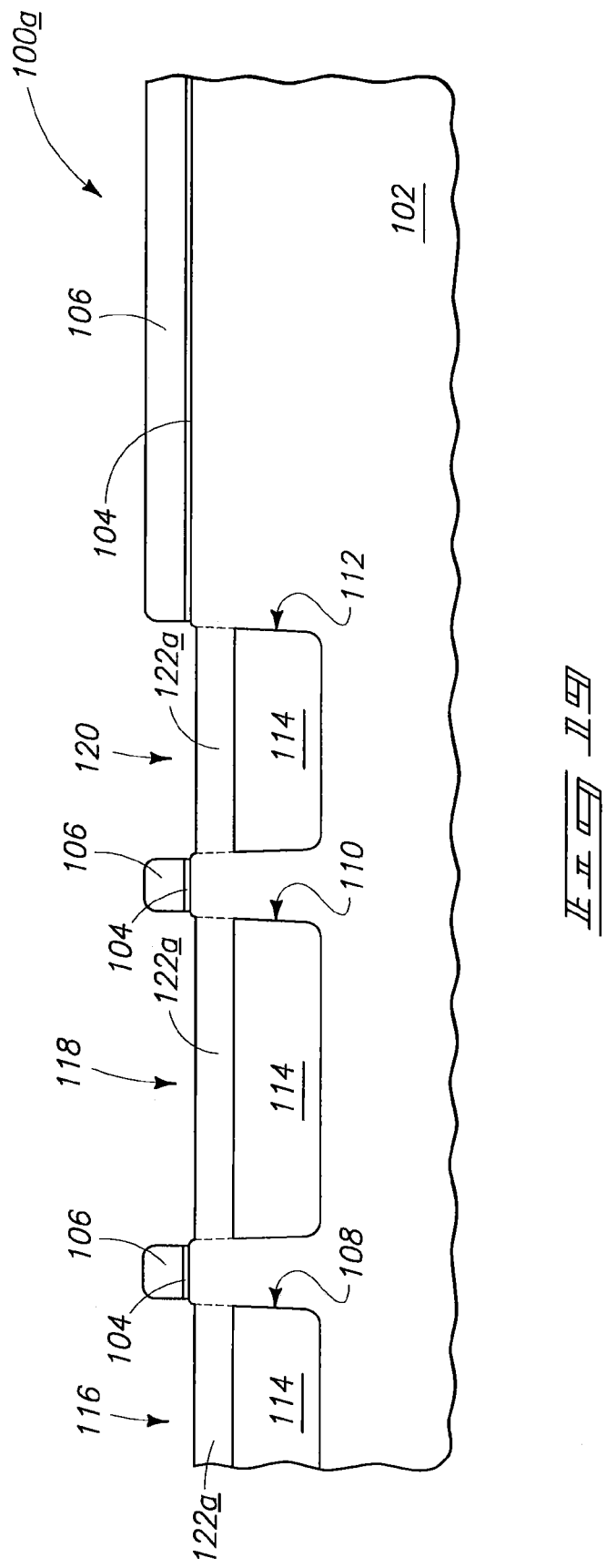
FIG. 19 is an alternate view of the FIG. 16 substrate showing alternate processing at a processing step subsequent to that shown by FIG. 16.
Figure 20:
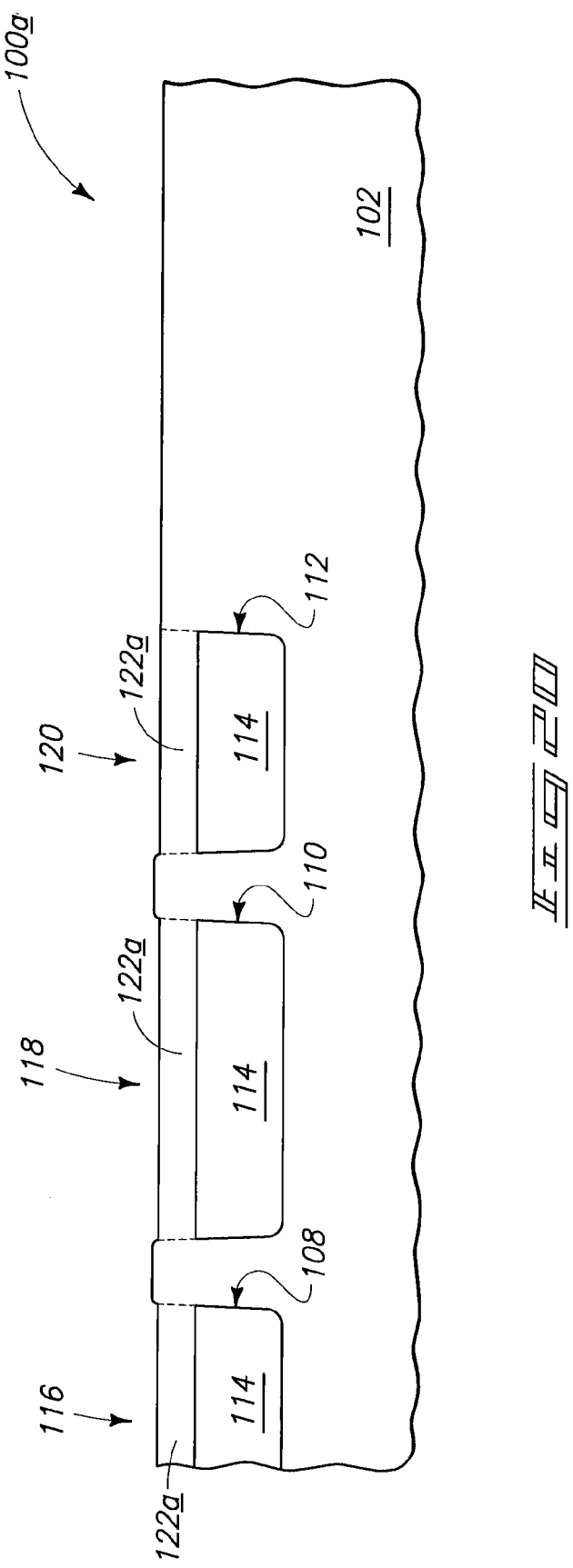
FIG. 20 is a view of the FIG. 19 substrate at a processing step subsequent to that shown by FIG. 19.

By way of example only, alternative processing to that depicted by FIGS. 17 and 18 is shown in FIGS. 19 and 20 with respect to a semiconductor substrate 100a. Like numerals from the FIGS. 17 and 18 embodiment have been utilized where appropriate, with differences being indicated with the suffix "a". In FIG. 19, epitaxially-grown silicon-comprising material 122a has been subjected to a suitable timed etch to recess it to below pad oxide 104. Silicon nitride 106 and pad oxide 104 are subsequently stripped (FIG. 20).

Figure 21:
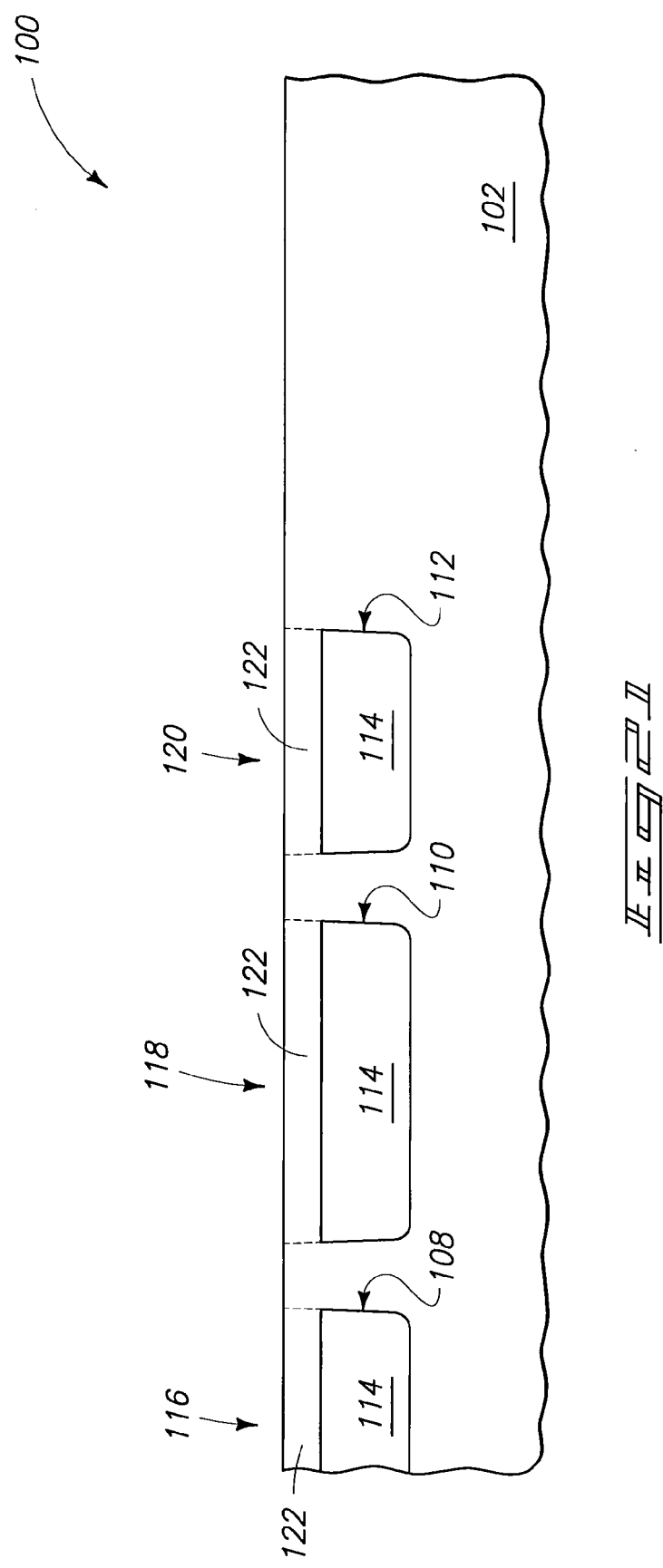
FIG. 21 is a view of the FIG. 18 substrate at a processing step subsequent to that shown by FIG. 18.

Referring to FIG. 21, the epitaxially-grown silicon-comprising material 122 of FIG. 18 has been planarized, for example by chemical mechanical polishing.

Figure 22:
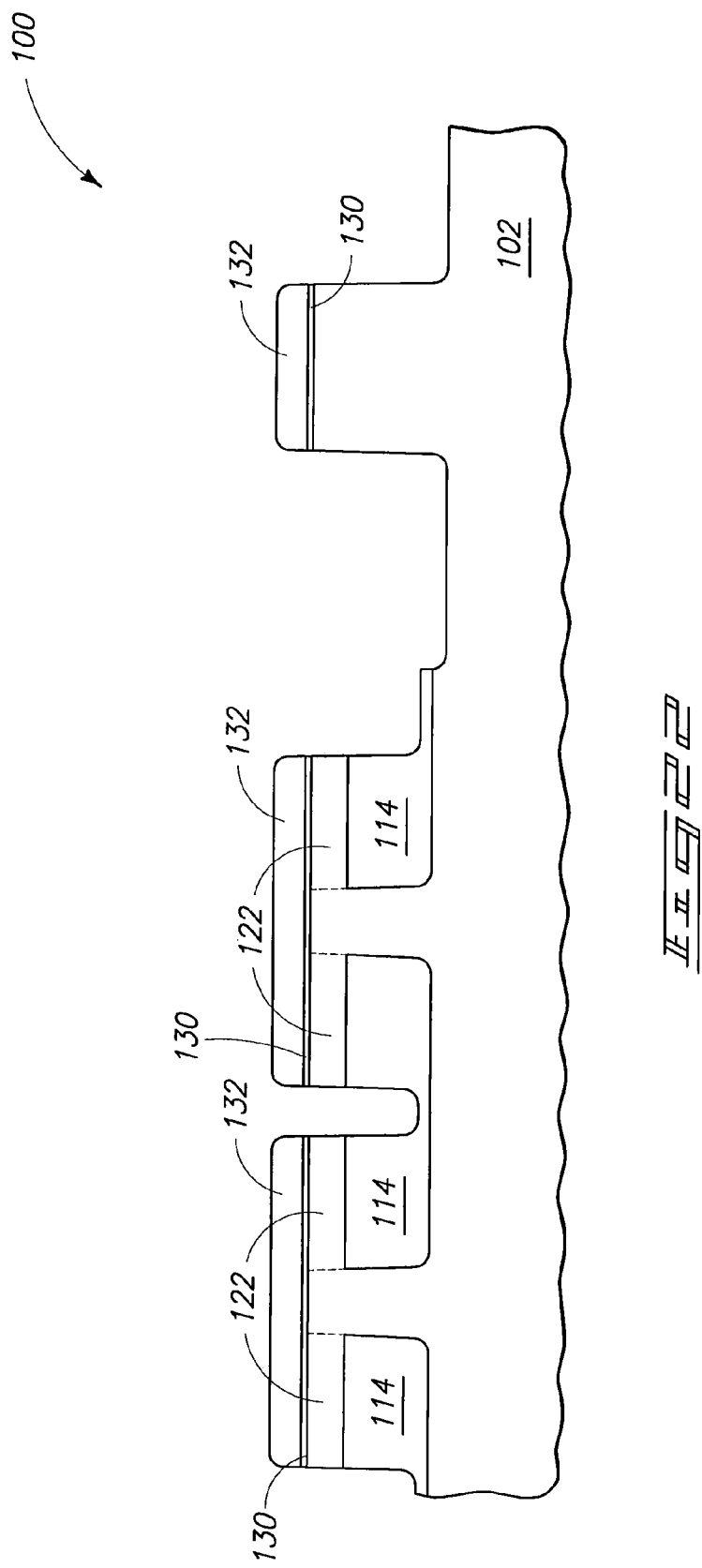
FIG. 22 is a view of the FIG. 21 substrate at a processing step subsequent to that shown by FIG. 21, and taken through line 22-22 in FIG. 23.

Referring to FIGS. 22 and 23, another pad oxide layer 130 and another silicon nitride masking layer 132 have been deposited and patterned, as shown, for the formation of additional trench isolation.

Figure 25:
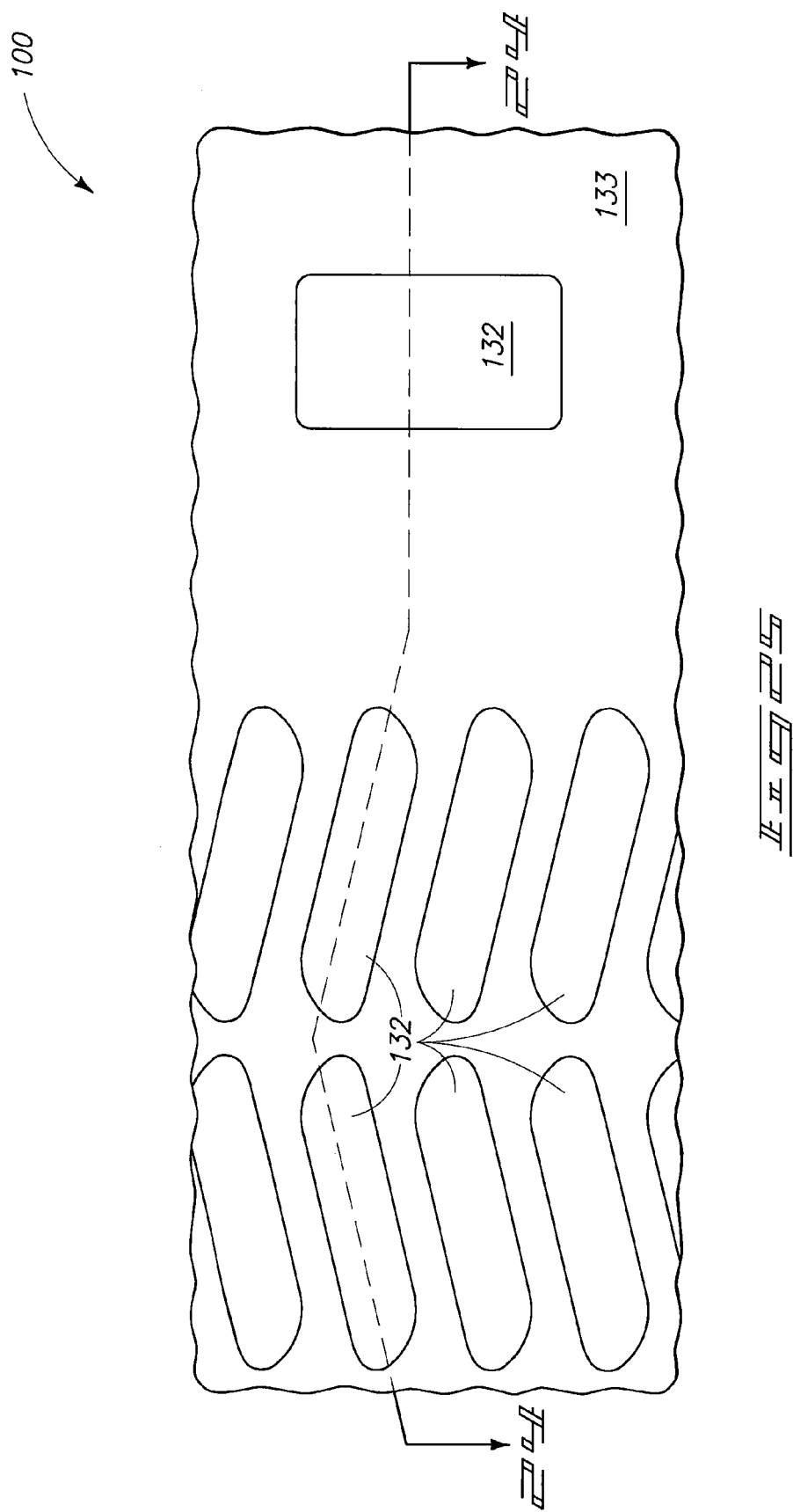
FIG. 25 is a top view of FIG. 24.

Referring to FIGS. 24 and 25, additional electrically insulative isolation material 133 has been deposited and planarized back, as shown. An exemplary preferred material is silicon dioxide, for example deposited by high density plasma deposition or as a spin-on-dielectric. Silicon nitride or other materials might of course be utilized, as well as other materials.

Figure 26:
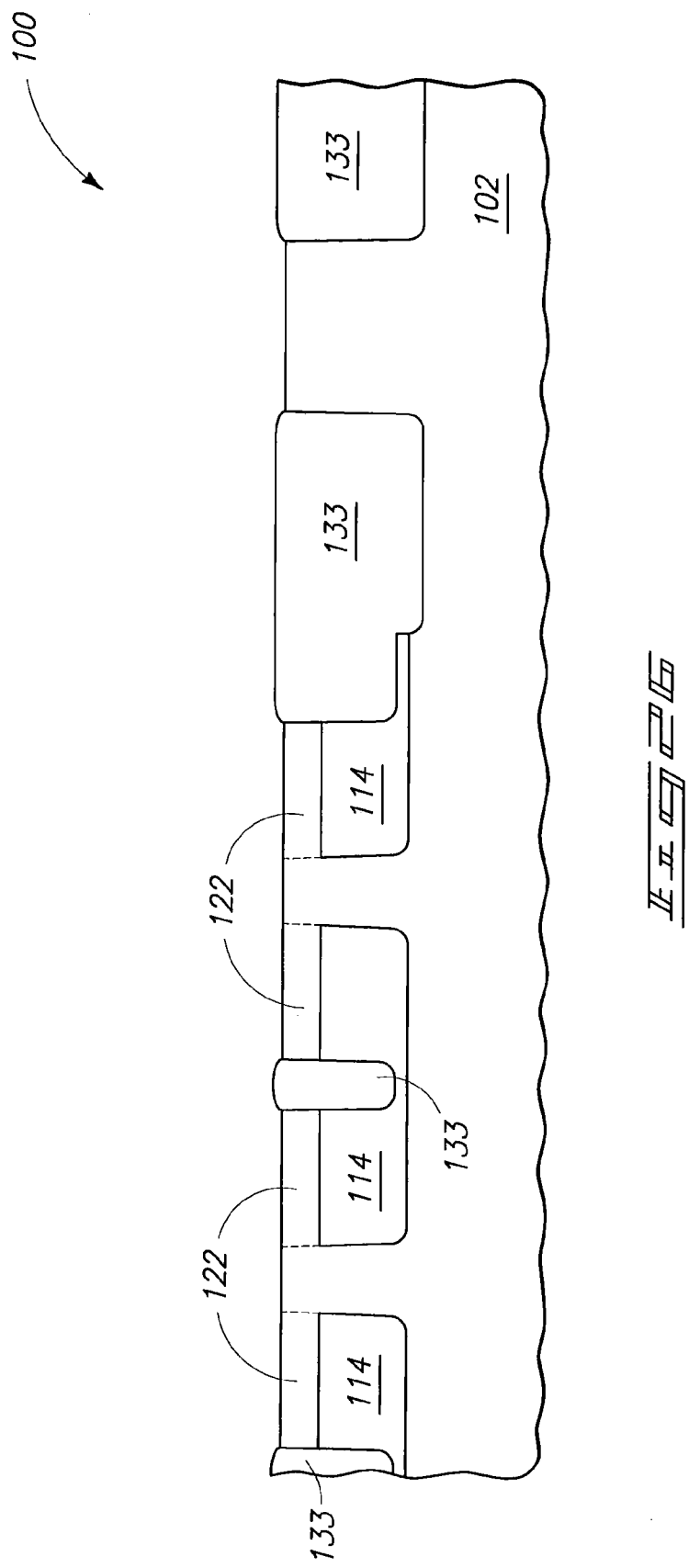
FIG. 26 is a view of the FIG. 24 substrate at a processing step subsequent to that shown by FIG. 24, and taken through line 26-26 in FIG. 27.
Figure 27:
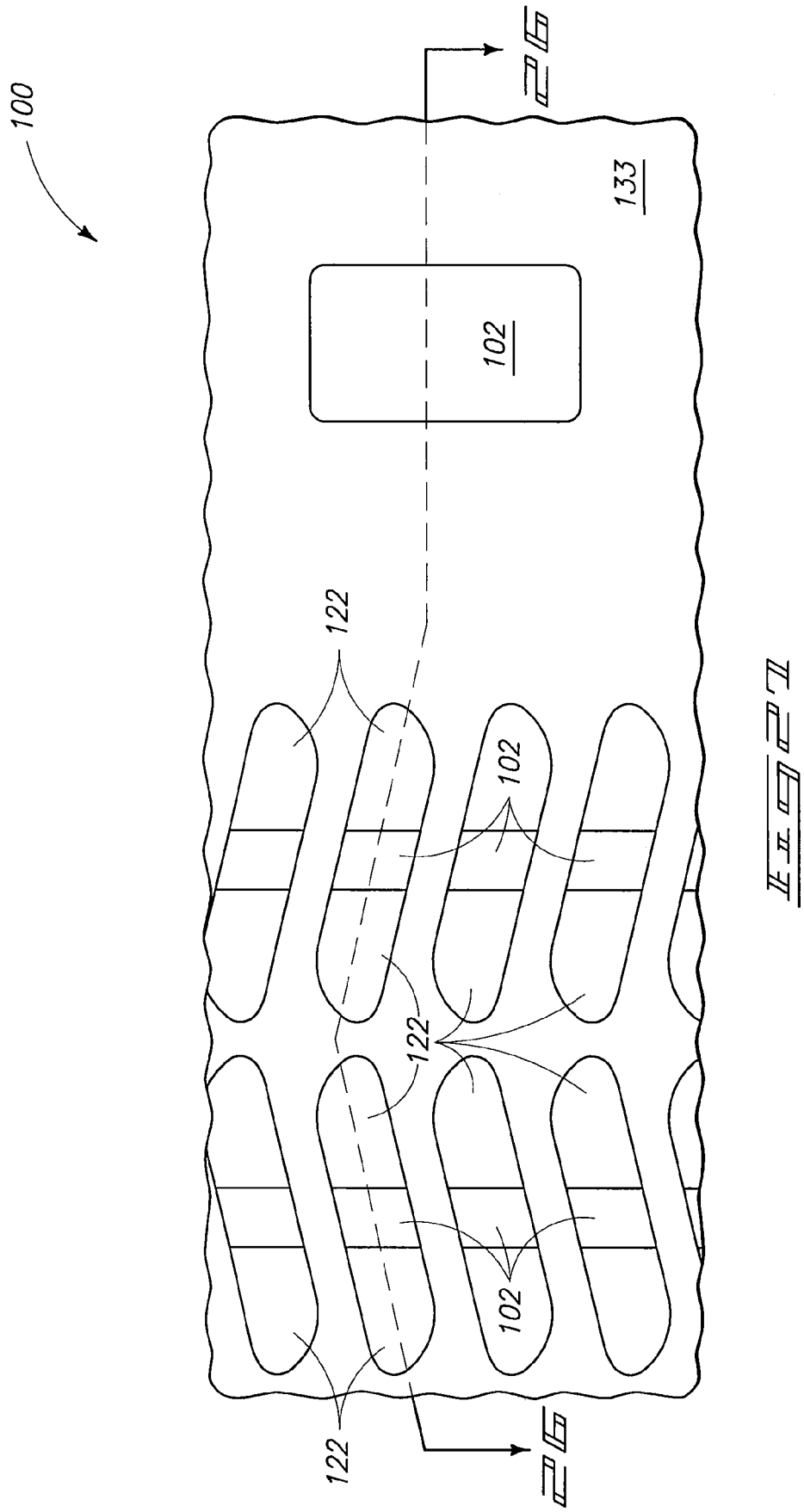
FIG. 27 is a top view of FIG. 26.

Referring to FIGS. 26 and 27, silicon nitride 132 and pad oxide 130 have been removed, preferably by any suitable wet or other etching.

Figure 28:
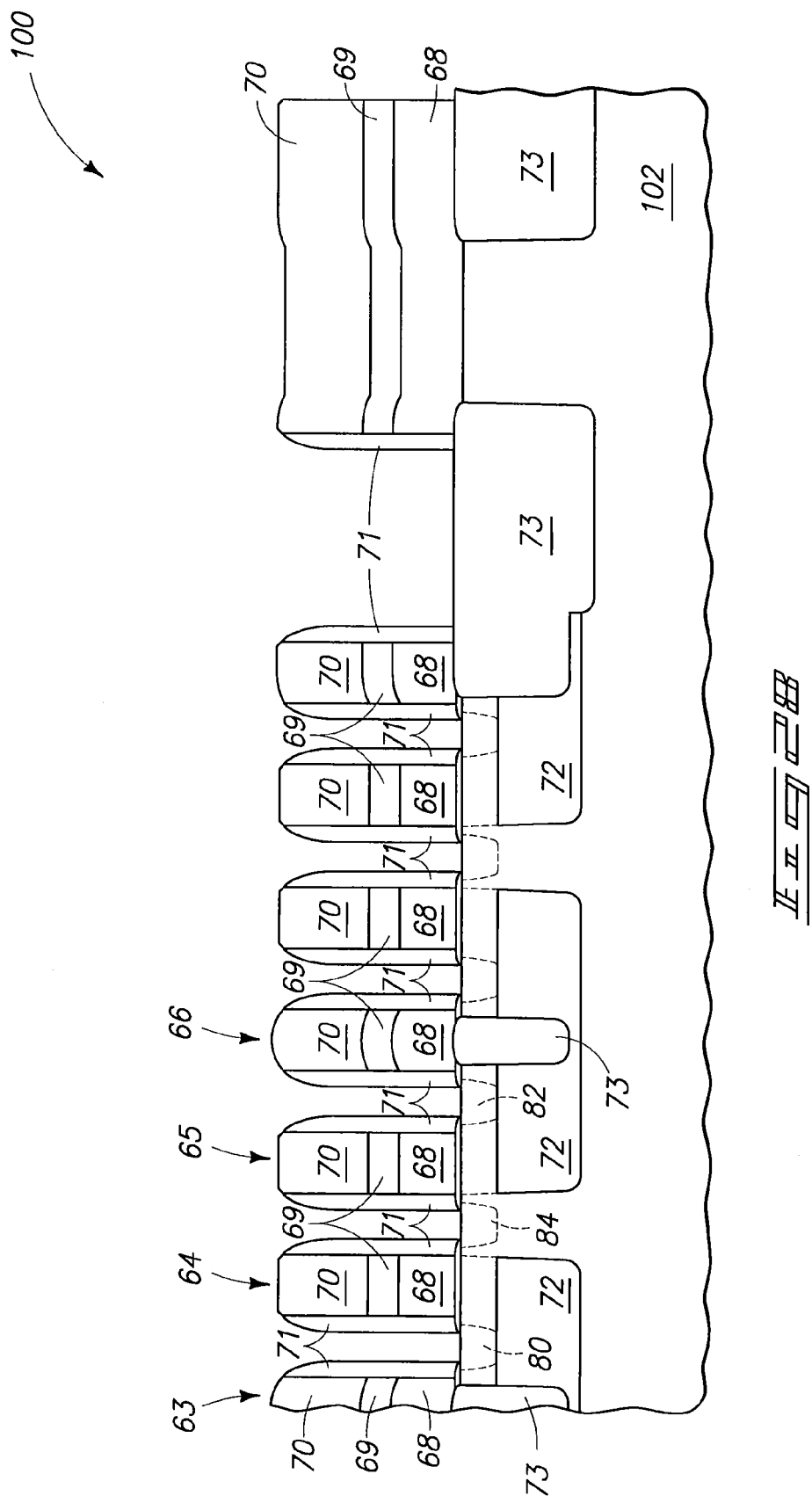
FIG. 28 is a view of the FIG. 26 substrate at a processing step subsequent to that shown by FIG. 26, and taken through line 28-28 in FIG. 29.

Referring to FIGS. 28 and 29, substrate 100 has been processed essentially to produce the construction shown in FIG. 11.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An integrated circuit comprising:
   a semiconductor substrate comprising bulk semiconductive material;
   electrically insulative material received within the bulk semiconductive material;
   a semiconductor material formed on the insulative material; and
   a field effect transistor comprising a gate, a channel region, and a pair of source/drain regions; one of the source/drain regions being formed entirely in the semiconductor material, the other of the source/drain regions being formed entirely in the bulk semiconductive material.

2. An integrated circuit comprising:
   a semiconductor substrate comprising bulk semiconductive material;
   electrically insulative material received within the bulk semiconductive material;

a semiconductor material formed on the insulative material; and a field effect transistor comprising a gate, a channel region, and a pair of source/drain regions; the channel region being received partially within the semiconductor material and partially within the bulk semiconductive material.

3. An integrated circuit comprising:

a semiconductor substrate comprising bulk semiconductive material;

electrically insulative material received within the bulk semiconductive material;

a semiconductor material formed on the insulative material; and a field effect transistor comprising a gate, a channel region, and a pair of source/drain regions; the electrically insulative material extending from beneath one of the source/drain regions to beneath only a portion of the channel region.

4. The integrated circuit of claim 1 wherein the semiconductive material and the semiconductor material are of the same composition.

5. The integrated circuit of claim 4 wherein the composition comprises monocrystalline silicon.

6. The integrated circuit of claim 1 wherein the semiconductor material comprises monocrystalline silicon.

7. The integrated circuit of claim 2 wherein the electrically insulative material extends from beneath one of the source/drain regions to beneath only a portion of the channel region.

8. The integrated circuit of claim 2 wherein the semiconductive material and the semiconductor material are of the same composition.

9. The integrated circuit of claim 8 wherein the composition comprises monocrystalline silicon.

10. The integrated circuit of claim 2 wherein the semiconductor material comprises monocrystalline silicon.

11. The integrated circuit of claim 3 wherein the semiconductive material and the semiconductor material are of the same composition.

12. The integrated circuit of claim 11 wherein the composition comprises monocrystalline silicon.

13. The integrated circuit of claim 3 wherein the semiconductor material comprises monocrystalline silicon.

14. The integrated circuit of claim 1 wherein the channel region is received partially within the semiconductor material and partially within the bulk semiconductive material.

15. The integrated circuit of claim 14 wherein the electrically insulative material extends from beneath one of the source/drain regions to beneath only a portion of the channel region.

16. The integrated circuit of claim 1 wherein the electrically insulative material extends from beneath one of the source/drain regions to beneath only a portion of the channel region.

17. The integrated circuit of claim 1 wherein the field effect transistor is encompassed in DRAM.

18. The integrated circuit of claim 2 wherein the field effect transistor is encompassed in DRAM.

19. The integrated circuit of claim 3 wherein the field effect transistor is encompassed in DRAM.

* * * * *

UNITED STATES PATENT AND TRADEMARK OFFICE
CERTIFICATE OF CORRECTION

PATENT NO. : 7,687,857 B2
APPLICATION NO. : 11/957013
DATED : March 30, 2010
INVENTOR(S) : Sanh D. Tang et al.

It is certified that error appears in the above-identified patent and that said Letters Patent is hereby corrected as shown below:

In column 1, line 15, delete "disclosure" and insert -- disclosures --, therefor.

In column 1, line 16, delete "is" and insert -- are hereby fully --, therefor.

Signed and Sealed this

First Day of June, 2010

David J. Kappos
*Director of the United States Patent and Trademark Office*